United States Patent
Lin et al.

(10) Patent No.: US 12,531,115 B2
(45) Date of Patent: Jan. 20, 2026

(54) SRAM CELL WITH WRITE-ASSIST TRANSISTORS

(71) Applicants: Taiwan Semiconductor Manufacturing Company, Ltd., Hsinchu (TW); NATIONAL TAIWAN UNIVERSITY, Taipei (TW)

(72) Inventors: Hsin-Cheng Lin, Taipei (TW); Tao Chou, New Taipei (TW); Kuan-Ying Chiu, Taoyuan (TW); Chee-Wee Liu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 203 days.

(21) Appl. No.: 18/240,709

(22) Filed: Aug. 31, 2023

(65) Prior Publication Data

US 2025/0078917 A1   Mar. 6, 2025

(51) Int. Cl.
  *G11C 11/419* (2006.01)
  *H01L 23/48* (2006.01)
  *H10B 10/00* (2023.01)
  *H10D 30/01* (2025.01)
  (Continued)

(52) U.S. Cl.
  CPC .......... *G11C 11/419* (2013.01); *H01L 23/481* (2013.01); *H10B 10/12* (2023.02); *H10D 30/024* (2025.01); *H10D 30/6211* (2025.01); *H10D 30/6219* (2025.01); *H10D 64/017* (2025.01)

(58) Field of Classification Search
  CPC ..... G11C 11/419; H01L 23/481; H10B 10/12; H10D 30/024; H10D 30/6211; H10D 30/6219; H10D 64/017; H10D 84/853; H10D 89/10; H10D 84/0158
  USPC .................................................. 365/189.011
  See application file for complete search history.

(56) References Cited

U.S. PATENT DOCUMENTS

| | | | |
|---|---|---|---|
| 9,041,115 B2* | 5/2015 | Liaw ................. | H10D 62/8325 |
| | | | 257/E27.099 |
| 2017/0110182 A1* | 4/2017 | Liaw ..................... | G11C 11/412 |
| 2021/0375355 A1 | 12/2021 | Yu et al. | |

FOREIGN PATENT DOCUMENTS

TW    202327046 A    7/2023

OTHER PUBLICATIONS

Chang et al., "A 5nm 135Mb SRAM in EUV and High-Mobility-Channel FinFET Technology with Metal Coupling and Charge-Sharing Write-Assist Circuitry Schemes for High-Density and Low-VMIN Applications", IEEE International Solid-State Circuits Conference—(ISSCC), 2020, p. 238-240.

(Continued)

*Primary Examiner* — Fernando Hidalgo
(74) *Attorney, Agent, or Firm* — Birch, Stewart, Kolasch & Birch, LLP

(57) ABSTRACT

An SRAM cell includes a first active region, a first gate structure, a second gate structure, and a first source/drain contact region. The first gate structure is over the first active region and forms a pull-up transistor with the first active region. The second gate structure is over the first active region and forms a write-assist transistor with the first active region. The write-assist transistor and the pull-up transistor are of a same conductivity type. The first source/drain contact region is over a source/drain of the write-assist transistor and a source/drain of the pull-up transistor.

20 Claims, 41 Drawing Sheets

(51) Int. Cl.
*H10D 30/62* (2025.01)
*H10D 64/01* (2025.01)

(56) References Cited

OTHER PUBLICATIONS

Kim et al., "Energy-Efficient High Bandwidth 6T SRAM Design on Intel 4 CMOS Technology", IEEE Symposium on VLSI Technology and Circuits (VLSI Technology and Circuits), 2022, p. 1087-1093.
Kumar et al., "SRAM Write Assist Techniques for Low Power Applications", International Conference on Signal Processing and Communication (ICSC), 2016, p. 425-430.
Nii et al., "2RW Dual-port SRAM Design Challenges in Advanced Technology Nodes", IEEE International Electron Devices Meeting (IEDM), 2015, p. 11.1.1-11.1.4.

\* cited by examiner

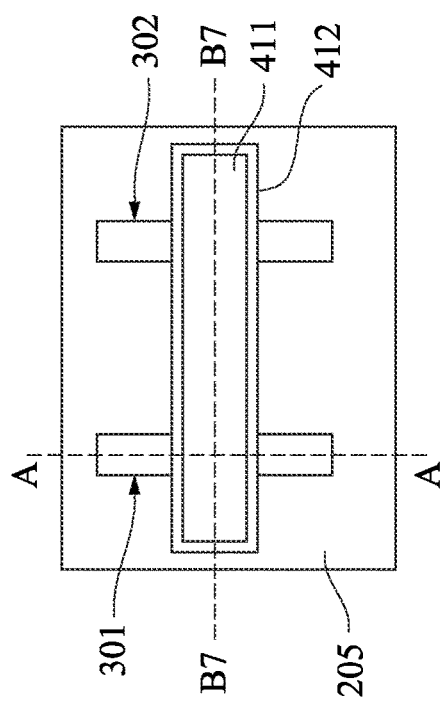
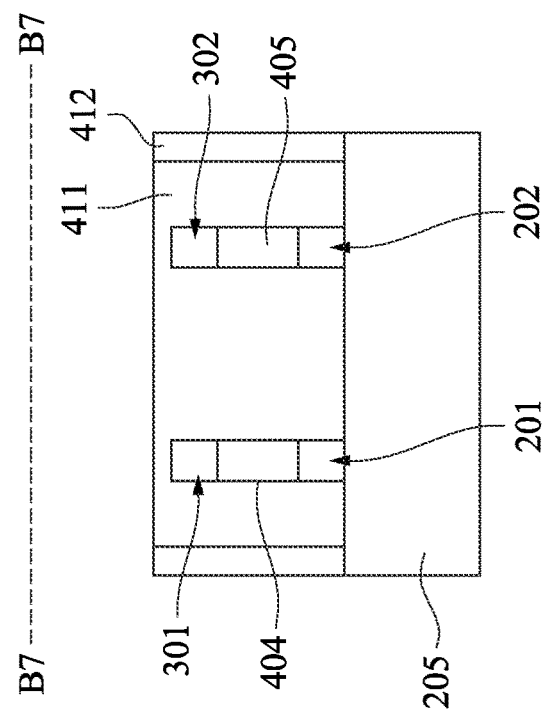
Fig. 19A
Fig. 19B

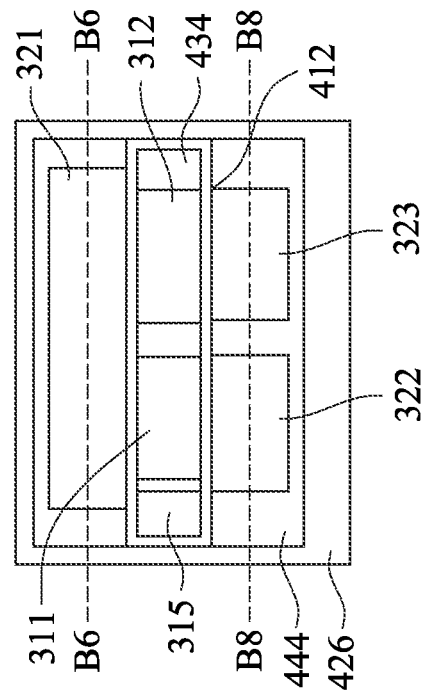
Fig. 26A
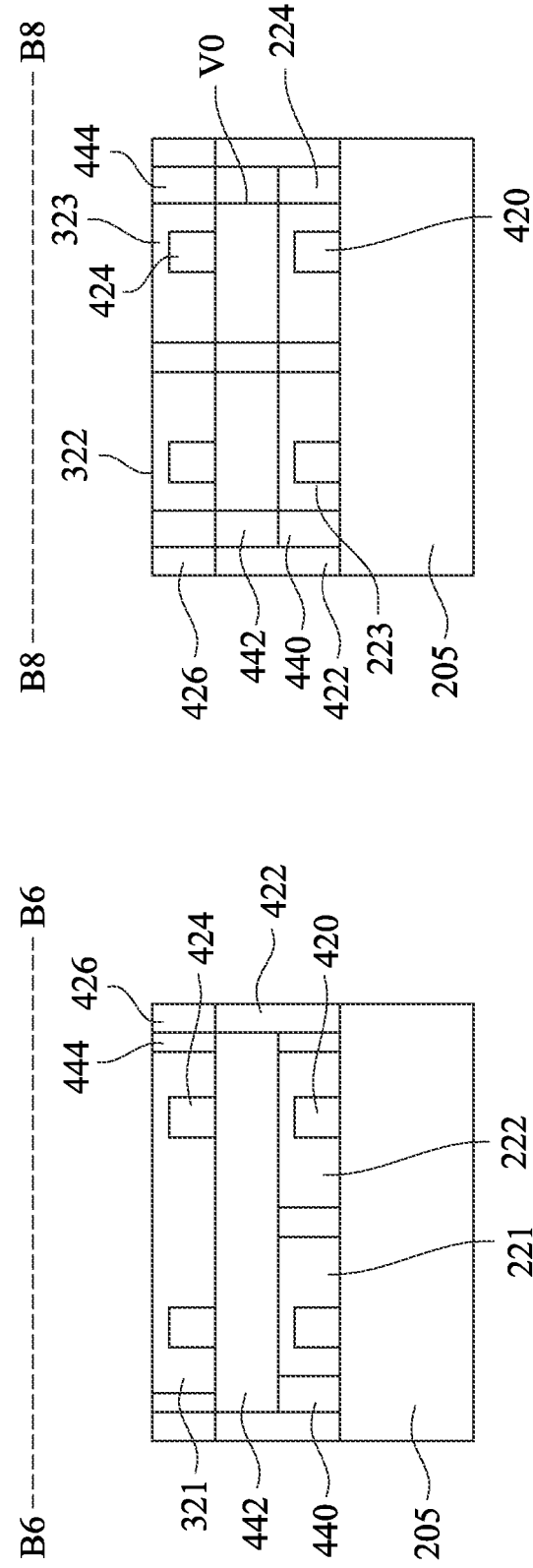
Fig. 26C
Fig. 26B

SRAM CELL WITH WRITE-ASSIST TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

A static random access memory (SRAM) cell has become a popular storage unit of high speed communication, high-density storage, image processing and system-on-chip (SOC) products. Although existing SRAM cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A-26C are top views and cross-sectional views of intermediate stages in an example method for manufacturing bottom-transistor-level elements and top-transistor-level elements for a CFET-based SRAM cell, in accordance with some embodiments.

DETAILED DESCRIPTION

Figure 1:
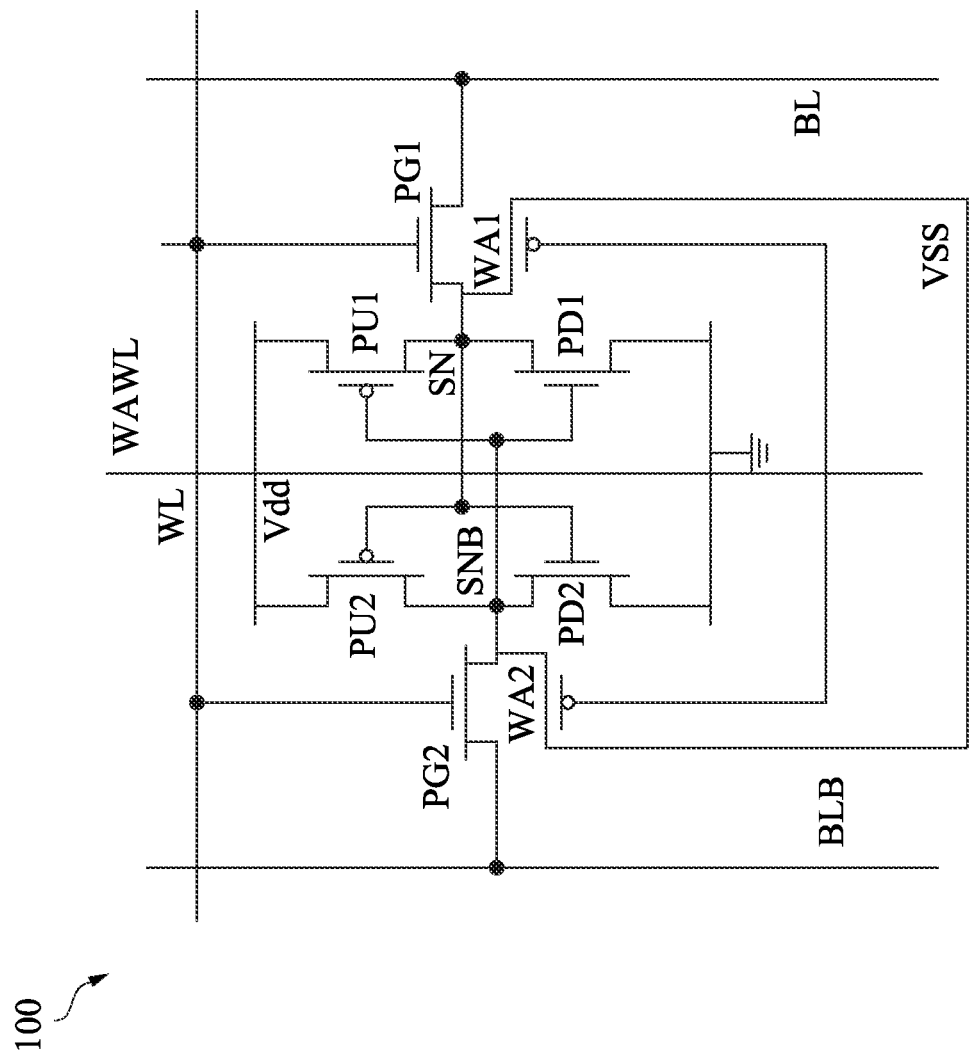
FIG. 1 illustrates a circuit diagram of an 8T SRAM cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced along with the down-scaling of the integrated circuits.

The present disclosure relates to semiconductor memory devices, and more particularly, to an improved SRAM cell structure. Embodiments of the present disclosure provide improved SRAM cell configurations by incorporating two additional write-assist transistors into six-transistor (6T) SRAM cell, resulting an eight-transistor (8T) cell with two pass-gate (PG) transistors, two pull-up (PU) transistors, two pull-down (PD) transistors, and two write-assist (WA) transistors. The write-assist transistors are strategically coupled to the storage nodes of the SRAM cell, enabling them to accelerate the charging and/or discharging operations of the storage nodes during the write operation, thereby enhancing the speed and efficiency of the write operation. Furthermore, the integration of write-assist transistors and pull-up transistors on the same fins offers a space-efficient solution, eliminating the need for extra space or extra footprint in the SRAM cell structure. This integration achieves a more compact design while maintaining the improved write operation speed of the SRAM cell. By optimizing the space utilization, the improved SRAM cell structure can be easily integrated into existing semiconductor processes without significant modifications or additional manufacturing complexity.

FIG. 1 illustrates a circuit diagram of an 8T SRAM cell 100 in accordance with some embodiments of the present disclosure. In FIG. 1, the SRAM cell 100 stores data in true and complementary form on storage nodes labeled "SN" and "SNB". Bit lines (sometimes called "digit" lines) send and receive data from the SRAM cell in true and complementary form on the bit line labeled "BL" and bit line bar labeled "BLB". In an SRAM array using the SRAM cells 100, the cells are arranged in rows and columns and the columns are generally formed by the bit line pairs, with the cells disposed between the respective bit line pairs. The pass-gate transistors PG1 and PG2 provide access to the storage nodes of the SRAM cell during read and write operations, and couple the storage nodes to the bit lines responsive to a voltage on the word line "WL".

The storage portion of the SRAM cell is formed of four transistors that make a cross coupled pair of CMOS inverters. Pull-up transistor PU1 and pull-down transistor PD1 form one inverter with an output at the storage node SN. Pull-up transistor PU2 and pull-down transistor PD2 form another inverter with the output at storage node SNB. The input of the first inverter is node SNB, coupled to the gates of the transistors PU1 and PD1, and the input of the second inverter is node SN, coupled to the gates of transistors PU2 and PD2. The pull-up transistors PU1 and PU2 may be p-type transistors. When the gate terminal of these p-type transistors is below a threshold voltage, these transistors will turn on and couple the cell positive voltage supply labeled "Vdd" to the respective storage node, thereby "pulling up" on the node at the output. The pull-down transistors and pass-gate transistors are n-type transistors. When the gate voltage exceeds a predetermined threshold voltage, the pull-down transistors turn on and couple the respective storage node to the ground or Vss supply labeled "Vss."

In operation, if the pass-gate transistors PG1 and PG2 are inactive (i.e., not turned on), the SRAM cell 100 will maintain the complementary values at nodes SN and SNB indefinitely. This is so because each inverter of the pair of cross coupled inverters drives the input of the other, thereby maintaining the voltages at the storage nodes. This situation will remain stable until the power is removed from the SRAM, or, a write operation is performed changing the stored data.

During a write operation, bit lines BL and BLB are set to opposite logic values according to the new data that will be written into the SRAM cell 100. For example, in an SRAM write operation, a logic state "1" stored in a data latch of the SRAM cell 100 can be reset by setting the bit line BL to "0" and the bit line BLB to "1". In response to a binary code from a row decoder (not shown), a word line coupled to the pass-gate transistors of the SRAM cell 100 is selected so that the data latch is selected to proceed to a write operation. After the SRAM cell 100 is selected, both the pass-gate transistors PG1 and PG2 are turned on. As a result, the storage nodes SN and SNB are connected to bit lines BL and BLB respectively. Furthermore, the storage node SN of the data latch is discharged by the bit line BL to "0" and the other storage node SNB of the data latch is charged by the bit line BLB to "1". As a result, the new data logic "0" is latched into the SRAM cell 100.

In a read operation, both bit lines BL and BLB of the SRAM cell 100 are pre-charged to a voltage approximately equal to the operating voltage of the memory bank in which the SRAM cell 100 is located. In response to a binary code from the row decoder, a word line coupled to the pass-gate transistors PG1 and PG2 of the SRAM cell 100 is asserted so that the data latch is selected to proceed to a read operation.

The SRAM cell 100 further includes write-assist transistors WA1 and WA2. The write-assist transistor WA1 has a first source/drain terminal coupled to the storage node SN, a second source/drain terminal coupled to the ground or Vss supply, and a gate terminal coupled to a write-assist word line labeled "WAWL." The write-assist transistor WA2 has a first source/drain terminal coupled to the storage node SNB, a second source/drain terminal coupled to the ground or Vss supply, and a gate terminal coupled to the write-assist word line WAWL. In this disclosure, a source and a drain can be interchangeably used and "source/drain" refers to one of a source and a drain.

During a write operation to write a new data logic "0" into the SRAM cell, the word line WL is activated (i.e., a logic one or "high" voltage) and thus turns on the pass-gate transistors PG1 and PG2, coupling the storage nodes SN, SNB to the respective bit lines BL, BLB. Meanwhile, during the write operation, the write-assist word line WAWL turns on the write-assist transistors WA1 and WA2. The activated write-assist transistor WA1 discharges the storage node SN, together with the discharge of the storage node SN by the pass-gate transistor PG1. Therefore, the speed and efficiency of the write operation can be improved by using at least the write-assist transistor WA1.

In a different write operation to write data logic "1" into the SRAM cell 100, a logic state "0" stored in a data latch of the SRAM cell 100 can be reset by setting the bit line BL to "1" and the bit line BLB to "0." In such a write operation, the storage node SN of the data latch is charged by the bit line BL to "1" and the other storage node of the data latch is discharged by the bit line BLB to "0". As a result, the new data logic "1" is latched into the SRAM cell 100. Meanwhile, during this write operation, the write-assist word line WAWL turns on the write-assist transistors WA1 and WA2. The activated write-assist transistor WA2 discharges the storage node SNB, together with the discharge of the storage node SNB by the pass-gate transistor PG2. Therefore, the speed and efficiency of the write operation can be improved by using at least the write-assist transistor WA2. In a read operation, the write-assist word line WAWL turns off the write-assist transistors WA1 and WA2.

Figure 2:
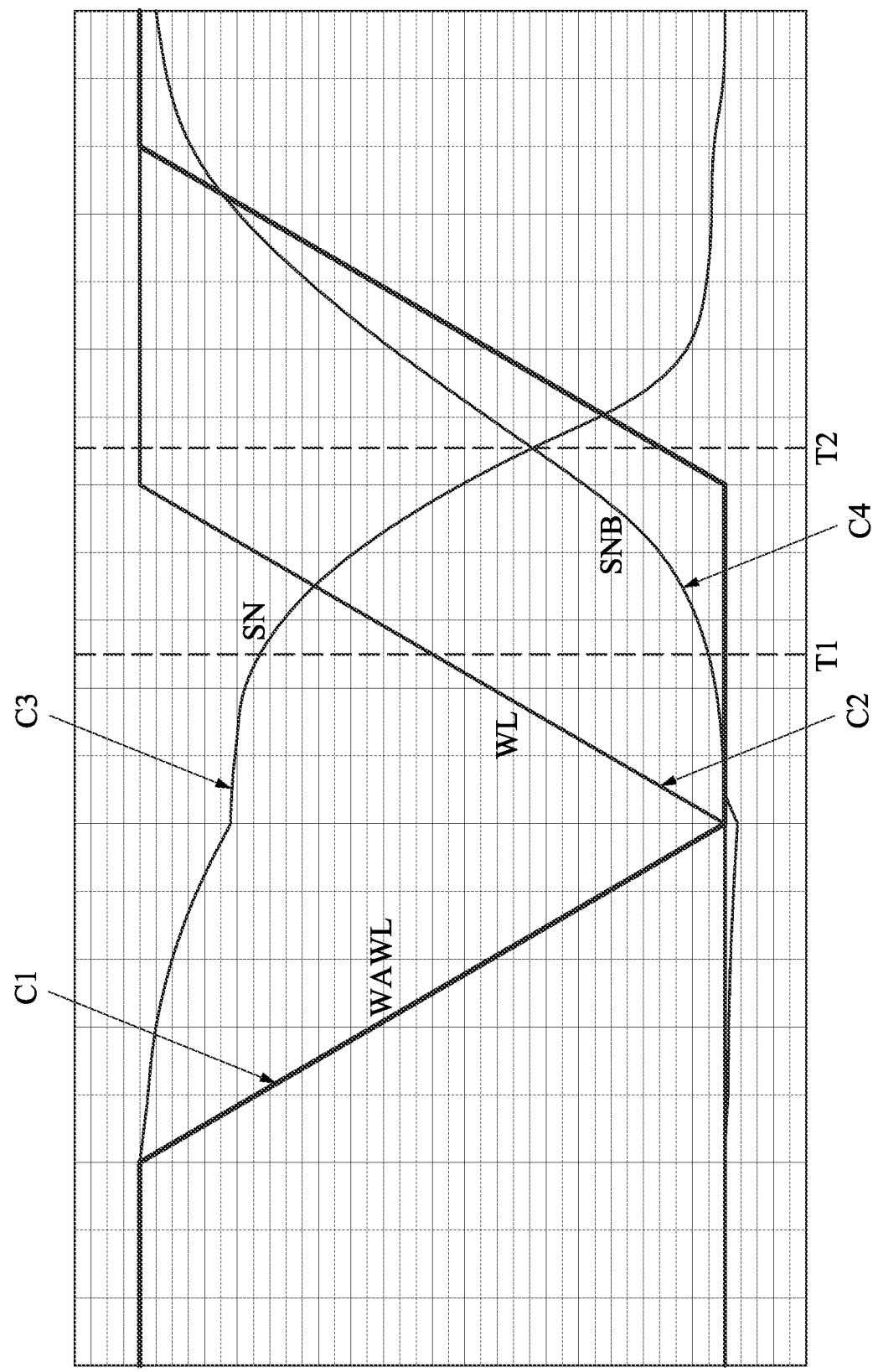
FIG. 2 is a graph illustrating a simulation result showing a write operation of an 8T SRAM cell in some embodiments.

FIG. 2 is a graph illustrating a simulation result showing a write operation of writing a data logic "0" into the ST SRAM cell 100, wherein time is shown on the horizontal axis in FIG. 2, and voltage is shown on the vertical axis in FIG. 2. The voltage curve C1 represents a voltage change on the write-assist word line WAWL. The voltage curve C2 represents a voltage change on the word line WL. The voltage curve C3 represents a voltage change on the storage node SN. The voltage curve C4 represents a voltage change on the storage node SNB. The timing T1 represents the timing when the word line voltage rises to half Vdd (i.e., ½ Vdd). The timing T2 represents the timing when the voltage on the storage node SN equals to the voltage on the storage node SNB. The write time of the 8T SRAM cell 100 equals to a time duration between the timing T1 and the timing T2.

Figure 3:
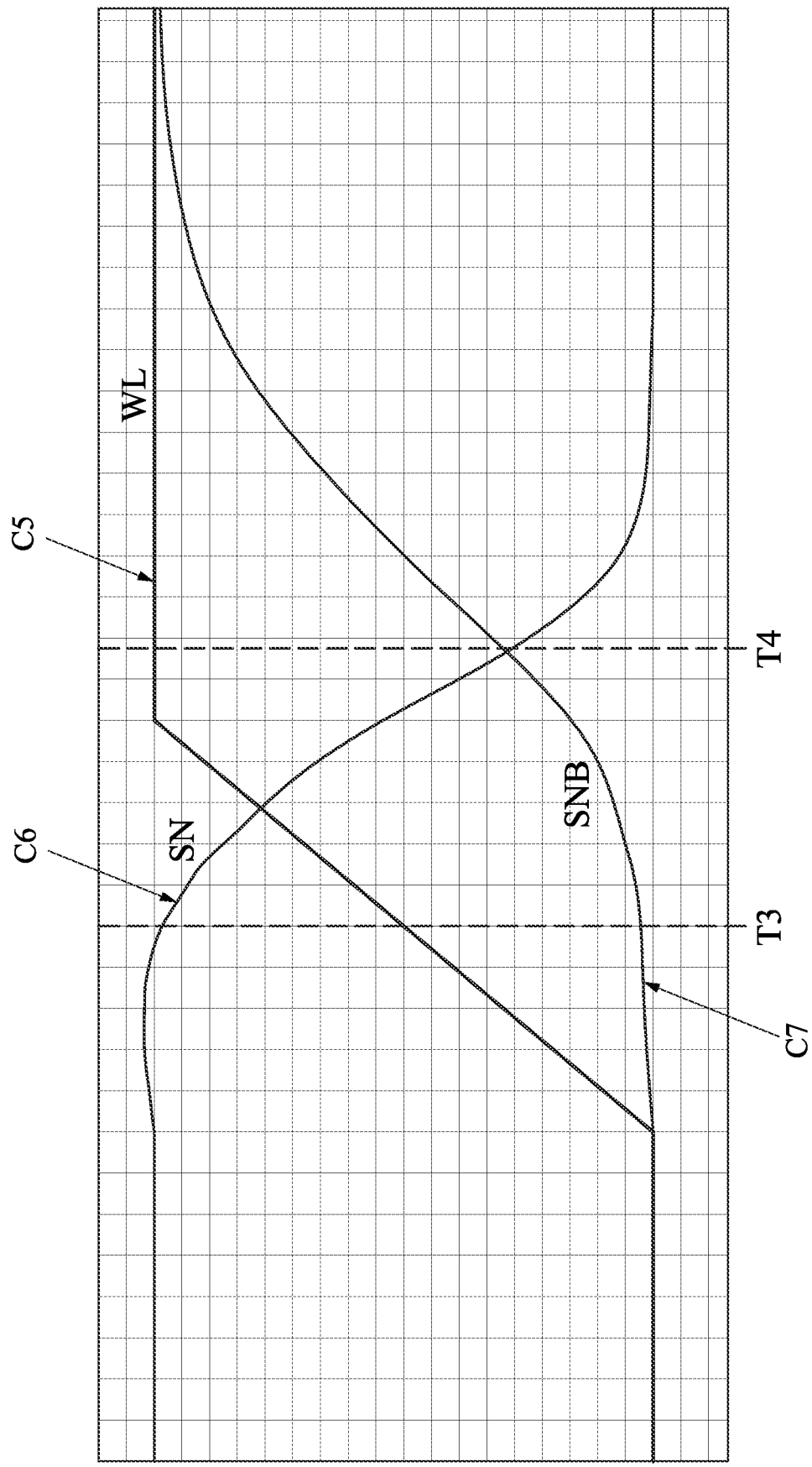
FIG. 3 is a graph illustrating a simulation result showing a write operation of a 6T SRAM cell without write-assist transistors.

FIG. 3 is a graph illustrating a simulation result showing a write operation of writing a data logic "0" into a 6T SRAM cell that does not include the write-assist transistors WA1, WA2 as illustrated in FIG. 1. Time is shown on the horizontal axis in FIG. 3, and voltage is shown on the vertical axis in FIG. 3. The voltage curve C5 represents a voltage change on the word line WL. The voltage curve C6 represents a voltage change on the storage node SN. The voltage curve C7 represents a voltage change on the storage node SNB. The timing T3 represents the timing when the word line voltage rises to half Vdd (i.e., ½ Vdd). The timing T4 represents the timing when the voltage on the storage node SN equals to the voltage on the storage node SNB. The write time of the 6T SRAM cell equals to a time duration between the timing T3 and the timing T4.

Comparing the simulation result of FIG. 2 with the simulation result of FIG. 3, it is evident that the 8T SRAM cell, which includes write-assist transistors, exhibits a reduction of at least 10% in the write time as compared to the 6T SRAM cell without the write-assist transistors. For example, the write time of 6T SRAM cell (i.e., the time duration between T3 and T4) is approximately 33 ps or more, but the write time of the 8T SRAM cell (i.e., the time duration between T1 and T2) is approximately 30 ps or less. This result shows that the SRAM write operation can be accelerated by using the write-assist transistors.

Figure 4:
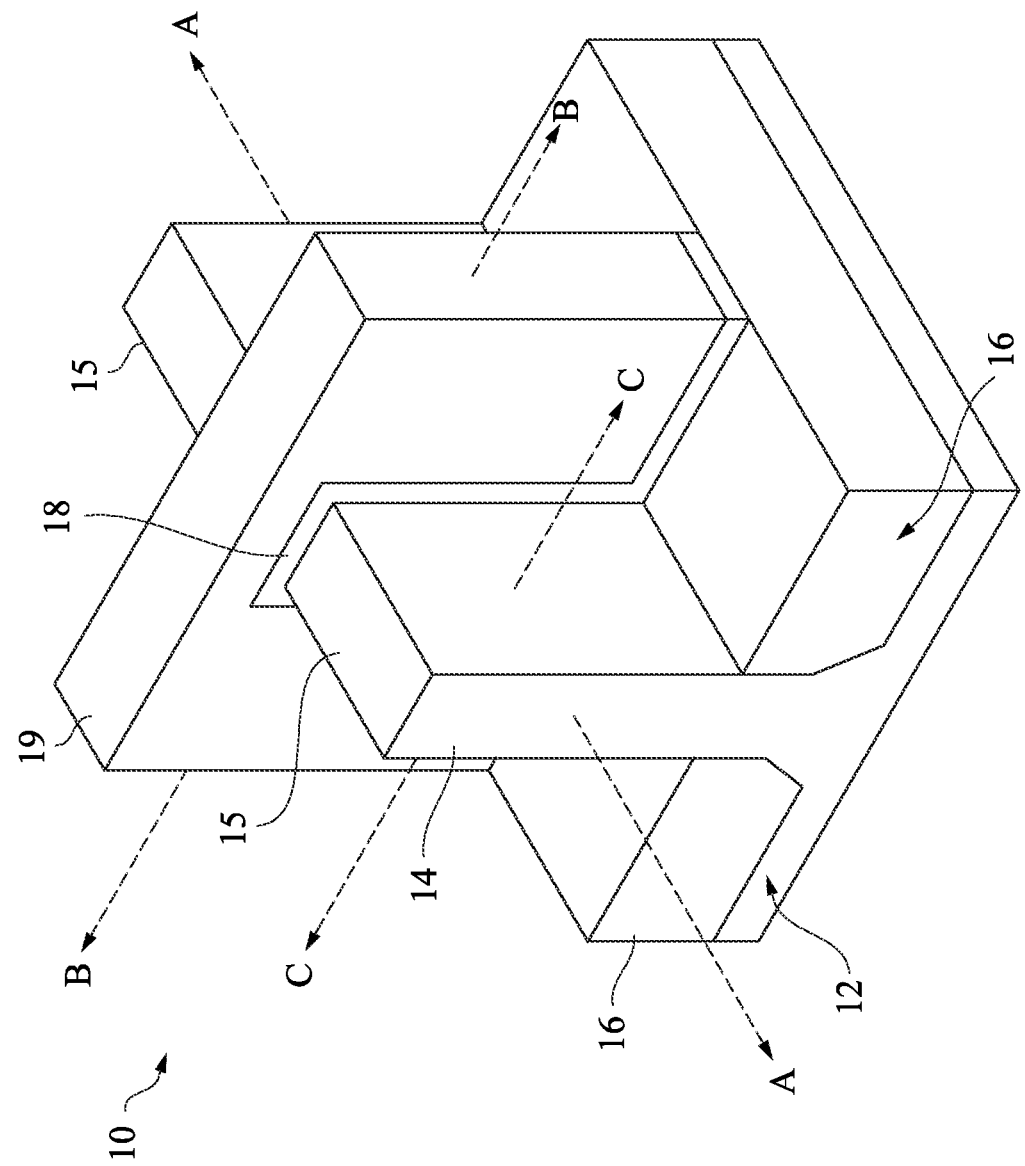
FIG. 4 illustrates an example of a FinFET in a perspective view.

In some embodiments, the SRAM cell structure includes a plurality of fin field transistor (FinFET) devices. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin. FIG. 4 illustrates an example of a FinFET 10 in a perspective view. The FinFET 10 includes a substrate 12 and a fin 14 protruding above the substrate 12. Isolation regions 16 are formed on opposing sides of the fin 14, with the fin 14 protruding above the isolation regions 16. A gate dielectric 18 is along sidewalls and over a top surface of the fin 14, and a gate electrode 19 is over the gate dielectric 18. Source/drain regions 15 are in the fin 14 and on opposing sides of the gate dielectric 18 and the gate electrode 19. FIG. 4 further illustrates reference cross-sections that are used in later figures. Cross-section B-B extends along a longitudinal axis of the gate electrode 19 of the FinFET 10. Cross-section A-A is perpendicular to cross-section B-B and is along a longitudinal axis of the fin 14 and in a direction of, for example, a current flow between the source/drain regions 15. Cross-section C-C is parallel to cross-section B-B and is across the source/drain region 15. Subsequent figures refer to these reference cross-sections for clarity.

Figure 5A:
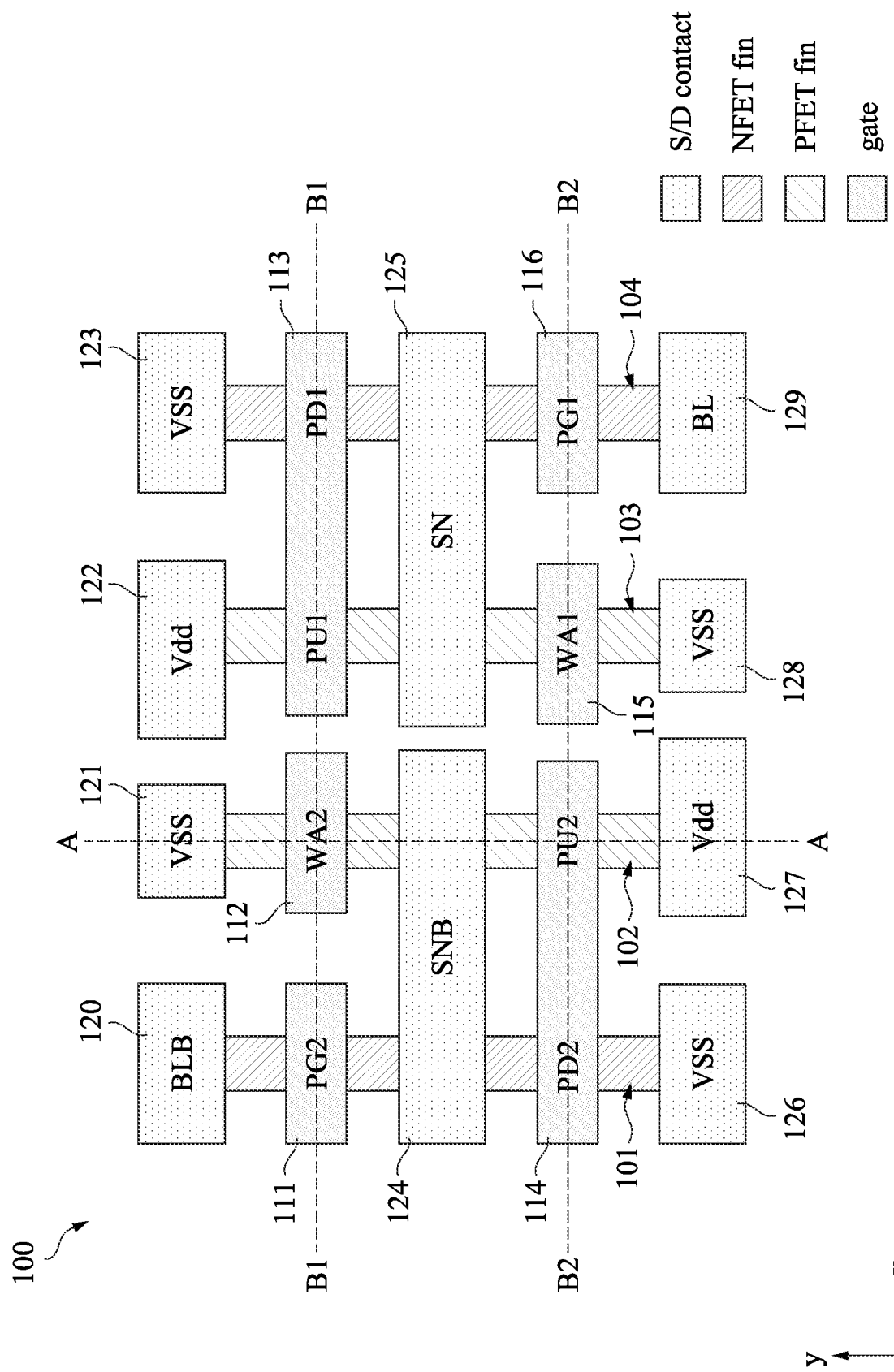
FIG. 5A depicts in a plan view a layout of an 8T SRAM cell in accordance with some embodiments of the present disclosure.
Figure 5B:
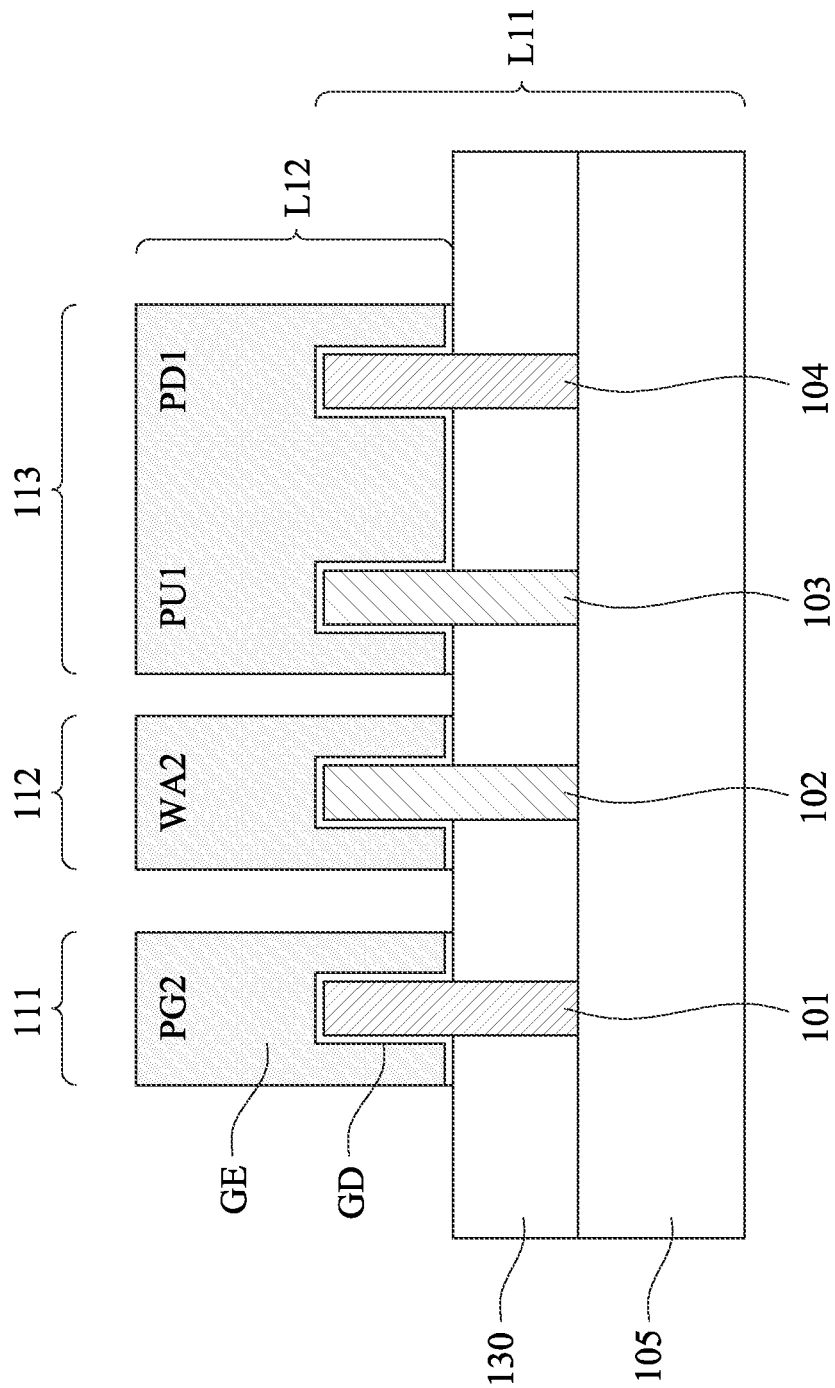
FIG. 5B is a cross-sectional view of the 8T SRAM cell along the cross-section B1-B1 in FIG. 5A.
Figure 5C:
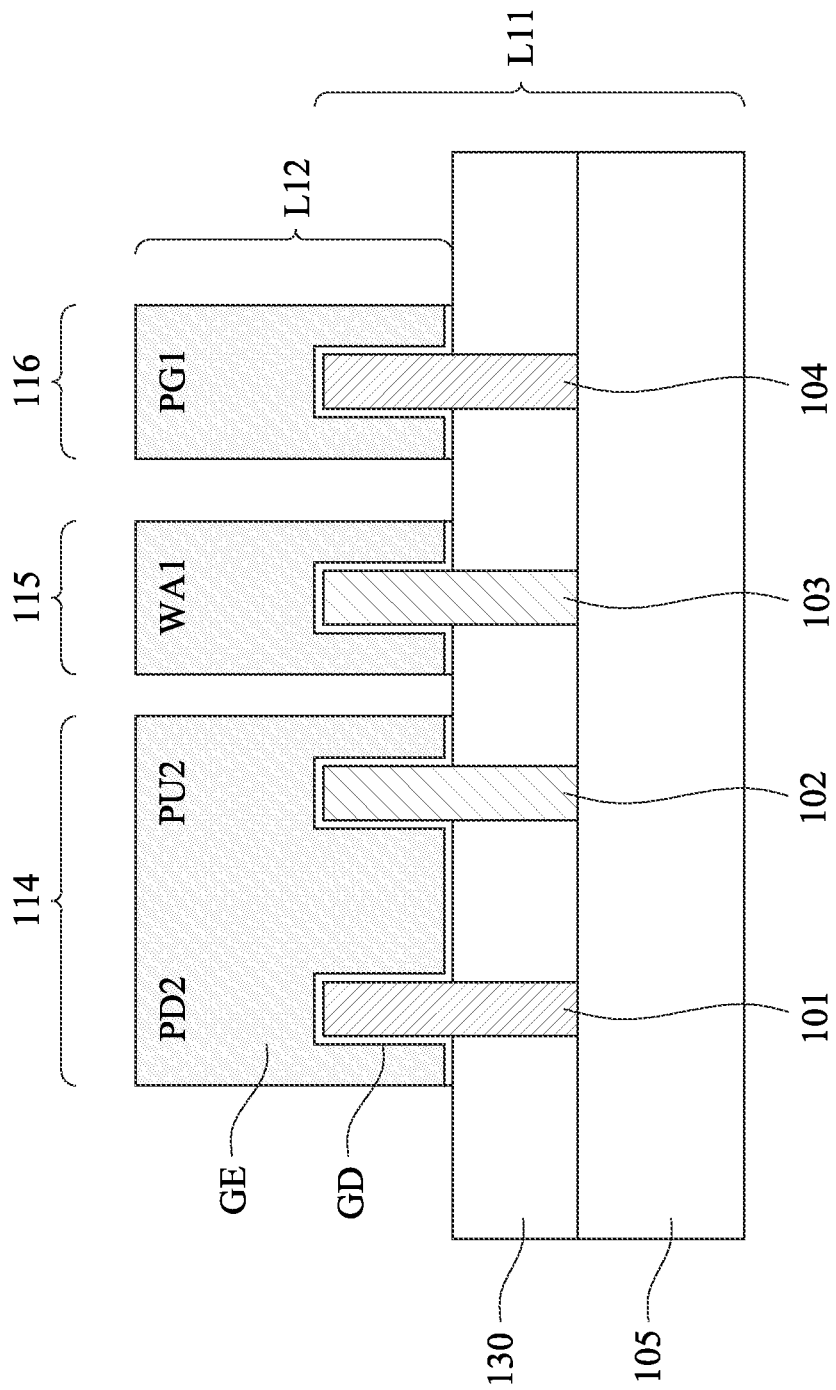
FIG. 5C is a cross-sectional view of the 8T SRAM cell along the cross-section B2-B2 in FIG. 5A.
Figure 5D:
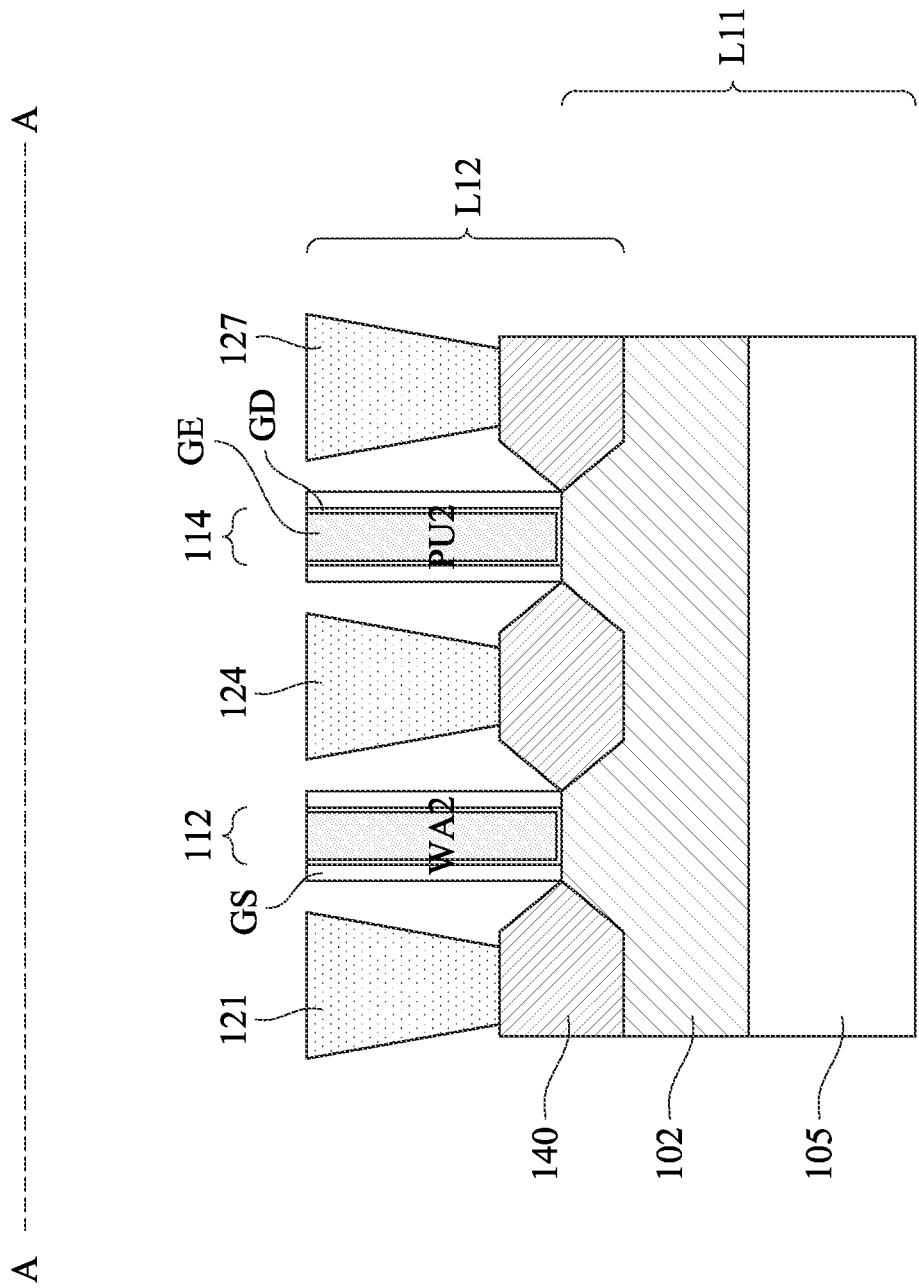
FIG. 5D is a cross-sectional view of the 8T SRAM cell along the cross-section A-A in FIG. 5A.

FIG. 5A depicts in a plan view a layout of an 8T SRAM cell 100 in accordance with some embodiments of the present disclosure. The layout in FIG. 5A is an overlaid layout of various levels including an active region level L11 and a gate region level L12. FIG. 5B is a cross-sectional view of the 8T SRAM cell 100 along the cross-section B1-B1, which extends along longitudinal axes of gates of the pass-gate transistor PG2, write-assist transistor WA2, pull-up transistor PU1 and pull-down transistor PD2. FIG. 5C is a cross-sectional view of the 8T SRAM cell 100 along the cross-section B2-B2, which extends along longitudinal axes of gates of the pass-gate transistor PG1, write-assist transistor WA1, pull-up transistor PU2 and pull-down transistor PD2. FIG. 5D is a cross-sectional view of the 8T SRAM cell 100 along the cross-section A-A, which extends along a longitudinal axis of the PFET fin shared by the pull-up transistor PU2 and the write-assist transistor WA2.

As shown in FIG. 5A-5D, there may be four active regions in a SRAM cell 100, each of which is formed by a fin. Fins are numbered 101, 102, 103, and 104 and are each a semiconductor fin. The fins 101-104 extend parallel in a y-direction shown in FIG. 5A across the cell height of the SRAM cell 100. Fins 101 and 104 serve to form n-type transistors (NFETs), such as pass-gate transistors PG1, PG2, and pull-down transistors PD1, PD2, and thus the fins 101 and 104 may be formed over P-type well regions. In some embodiments, the pass-gate transistor PG2 and the pull-down transistor PD2 share a same NFET fin 101, and the pass-gate transistor PG1 and the pull-down transistor PD1 share a same NFET fin 104. Fins 102 and 103 serve to form p-type transistors (PFETs), such as pull-up transistors PU1, PU2, and write-assist transistors WA1, WA2, and thus the fins 102 and 103 may be formed over an N-type well region between the P-type well regions. In some embodiments, the pull-up transistor PU2 and the write-assist transistor WA2 share a same PFET fin 102, and the pull-up transistor PU1 and the write-assist transistor WA1 share a same PFET fin 103. Therefore, integrating the write-assist transistors WA1 and WA2 into the SRAM cell will cause no footprint increase in the SRAM cell.

FIG. 5A further illustrates six gate regions. Gate regions are numbered 111, 112, 113, 114, 115, and 116 and each may be a high-k/metal gate (HKMG) structure comprising one or more dielectric layers (including high-k dielectric) and one or more metal layers over the one or more dielectric layers. The gate regions extend parallel in the x-direction shown in FIG. 5A along the cell length of the SRAM cell 100. In addition, the fins are orthogonal to the gate regions in the layout diagram. A transistor is formed at a cross point of a fin and a gate region. As shown in FIG. 5A, the eight transistors of the SRAM cell 100 are formed at different cross points. In particular, the pass-gate transistor PG2 is formed at the cross point of the NFET fin 101 and the gate region 111, the pull-down transistor PD2 is formed at the cross point of the NFET fin 101 and the gate region 114, the write-assist transistor WA2 is formed at the cross point of the PFET fin 102 and the gate region 112, the pull-up transistor PU2 is formed at the cross point of the PFET fin 102 and the gate region 114, the pull-up transistor PU1 is formed at the cross point of the PFET fin 103 and the gate region 113, the write-assist transistor WA1 is formed at the cross point of the PFET fin 103 and the gate region 115, the pull-down transistor PD1 is formed at the cross point of the NFET fin 104 and the gate region 113, and the pass-gate transistor PG1 is formed at the cross point of the NFET fin 104 and the gate region 116.

As shown in FIG. 5A, a single gate region 113 is used as the gates of the pull-down transistor PD1 and the pull-up transistor PU1. Another single gate region 114 is used as the gates of the pull-down transistor PD2 and the pull-up transistor PU2. In this manner, each single gate region electrically couples the gates of the respective two transistors. In FIG. 5A, a single gate region 112 is dedicated to the write-assist transistor WA2. Another single gate region 115 is dedicated to the write-assist transistor WA1. In FIG. 5A, a single gate region 111 is dedicated to the pass-gate transistor PG2. Another single gate region 116 is dedicated to the pass-gate transistor PG1. However, in some embodiments, the single gate region dedicated to the pass-gate transistor PG1 may extend beyond a cell boundary so that the gate region can be shared by an adjacent SRAM cell (not shown), as does the gate region for the pass-gate transistor PG2. In some embodiments, the gate region 112 is aligned with but separated from the gate regions 111 and 113 in the x-direction, and thus the gate of write-assist transistor WA2 is independent of neighboring gates of the pass-gate transistor PG2 and the pull-up transistor PU1. Similarly, the gate region 115 is aligned with but separated from the gate regions 114 and 116 in the x-direction, and thus the gate of write-assist transistor WA1 is independent of neighboring gates of the pass-gate transistor PG1 and the pull-up transistor PU1. In some embodiments, the gate regions 112, 115 have a length in the x-direction shorter than a length of the gate regions 113, 114 in the x-direction, because gate regions 112, 115 each cross a single fin, but the gate regions 113, 114 each cross at least two fins.

FIG. 5A further illustrates source/drain contact regions. Source/drain contact regions are numbered 120, 121, 122, 123, 124, 125, 126, 127, 128, and 129, and each contact region includes one or more metal materials in a contact opening formed in an interlayer dielectric (ILD) layer, and will provide a vertical connection to overlying back-end-of-line (BEOL) interconnect structures. The source/drain contact regions also provide local interconnections between devices within a same level, for example a source/drain region of the NFET fin 101 is coupled to a source/drain region of the PFET fin 102 by using the contact region 124, and a source/drain region of the NFET fin 104 is coupled to a source/drain region of the PFET fin 103 by using the contact region 125. In particular, the contact region 124 serves as a contact of storage node SNB, which couples together source/drain terminals of the transistors PU2, PD2, PG2, and WA2; and the contact region 125 serves as a contact of storage node SN, which couples together source/drain terminals of the transistors PU1, PD1, PG1, and WA1. The contact region 124 can be interchangeably referred to as a storage node contact serving for the storage node SNB, and the contact region 125 can be interchangeably referred to as a storage node contact serving for the storage node SN.

The contact region 120 is electrically coupled to a bit line BLB by using one or more interconnect vias in one or more upper metallization levels (not shown in FIG. 5A), and thus the contact region 120 can be interchangeably referred to as a bit line contact coupled to BLB. The contact region 129 is electrically coupled to a bit line BL by using one or more interconnect vias in one or more upper metallization levels (not shown in FIG. 5A), and thus the contact region 129 can be interchangeably referred to as a bit line contact coupled to BL.

The contact regions 121, 123, 126, and 128 are electrically coupled to ground or Vss supply by using interconnect vias and metal lines in one or more upper metallization levels (not shown in FIG. 5A), and thus these contact region 121, 123, 126, and 128 can be interchangeably referred to as Vss contacts. The contact regions 122 and 127 are electrically coupled to Vdd supply by using interconnect vias and metal lines in one or more upper metallization levels (not shown in FIG. 5A), and thus these contact region 122 and 127 can be interchangeably referred to as Vdd contacts.

As illustrated in FIG. 5A, the write-assist transistor WA1 has a first source/drain terminal coupled to Vss by using the Vss contact 128, and a second source/drain terminal coupled to the storage node SN by using the storage node contact 125. The write-assist transistor WA2 has a first source/drain terminal coupled to Vss by using the Vss contact 121, and a second source/drain terminal coupled to the storage node SNB by using the storage node contact 124. The write-assist transistors WA1, WA2 can thus shorten the write time of the SRAM cell 100, as discussed previously with respect to FIGS. 1-3.

In various cross-sectional views as illustrated in FIGS. 5B-5D, the SRAM cell 100 is formed on a substrate 105. The substrate 105 may be a semiconductor substrate, such as a bulk semiconductor, a semiconductor-on-insulator (SOI) substrate, or the like, which may be doped (e.g., with a p-type or an n-type dopant) or undoped. The substrate 105 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 105 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. P-type well regions and N-type well regions are formed in the substrate 105 by using suitable doping methods.

The fins 101-104 may be formed by patterning the semiconductor substrate 105 using photolithography and etching techniques, and thus the resulting fins 101-104 are formed of semiconductor materials as well. Therefore, these fins can be interchangeably referred to as semiconductor fins in the present disclosure. For example, a spacer image transfer (SIT) patterning technique may be used to for the semiconductor fins. In this method a sacrificial layer is formed over the substrate 105 and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fins 101-104 by etching trenches into the substrate 105 using, for example, reactive ion etching (RIE).

The fins 101-104 are electrically isolated from each other by an isolation structure 130. In some embodiments, the isolation structure 130 is a shallow trench isolation (STI) structure including a trench in the substrate 105 filled with one or more dielectric materials. In some embodiments, the STI structure includes silicon dioxide, silicon nitride, silicon oxynitride, or any other suitable insulating materials.

The STI structure 130 may be formed by depositing one or more dielectric materials (e.g., silicon oxide) to completely fill the trenches around the fins 101-104 and then recessing the top surface of the dielectric materials to fall below topmost ends of the fins 101-104. The dielectric materials of the STI structure 130 may be deposited using a high density plasma chemical vapor deposition (RDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI structures 130 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI structure 130 such that an upper portion of the first and second fins 101-104 protrude from surrounding insulating STI structure 130. In some cases, the patterned hard mask used to form the first and second fins 101-104 may also be removed by the planarization process.

The NFET fins 101, 104 and PFET fins 102, 103 each include a plurality of source/drain regions 140, as illustrated in FIG. 5D. The source/drain regions 140 are doped semiconductor regions located on opposite sides of the corresponding gate regions 111-116. The source/drain regions 140 on PFET fins 102 and 103 include p-type dopants such as boron for formation of p-type FETs, and the source/drain regions 140 on NFET fins 101 and 104 include n-type dopants such as phosphorus for formation of n-type FETs.

In some embodiments, the write-assist transistor WA2 and the pull-up transistor PU2 share a same p-type source/drain region 140 between the gate regions 112 and 114 to serve as their source/drain terminals. Similarly, the write-assist transistor WA1 and the pull-up transistor PU1 share a same p-type source/drain region 140 between the gate regions 113 and 116 to serve as their source/drain terminals. Similarly, the pass-gate transistor PG2 and the pull-down transistor PD2 share a same n-type source/drain region 140 between the gate regions 111 and 114 to serve as their source/drain terminals, and the pass-gate transistor PG1 and the pull-down transistor PD1 share a same n-type source/drain region 140 between the gate regions 111 and 114 to serve as their source/drain terminals.

In some embodiments, the source/drain regions 140 may be epitaxially grown regions. For example, gate spacers GS may be formed alongside dummy gate structures (which will be replaced with the final gate structures 111-116) by depositing a spacer material and anisotropically etching the spacer material, and subsequently, the source/drain regions 140 may be formed self-aligned to the gate spacers GS by first etching the fins 101-104 to form recesses, and then depositing a crystalline semiconductor material in the recess by a selective epitaxial growth (SEG) process that may fill the recesses in the fins 101-104 and may extend further beyond the original surface of the fins 101-104 to form raised source/drain epitaxy structures in some embodiments. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into source/drain regions 140 either in situ during SEG, or by an ion implantation process performed after the SEG, or by a combination thereof.

In some embodiments, the gate regions 111-116 are high-k metal gate (HKMG) gate structures that may be formed using a gate-last process flow (interchangeably referred to as gate replacement flow). In a gate-last process flow a sacrificial dummy gate structure (e.g., polysilicon gate, not shown) is formed after forming the STI structure 130. The dummy gate structure may comprise a dummy gate dielectric, a dummy gate electrode (e.g., polysilicon gate), and a hard mask. First a dummy gate dielectric material (e.g., silicon oxide, silicon nitride, or the like) may be deposited. Next a dummy gate material (e.g., polysilicon) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask layer and transferring that pattern to the dummy gate dielectric and dummy gate material using suitable photolithography and etching techniques. The dummy gate structure may extend along multiple sides of the protruding fins 101-104 and over the surface of the STI structure 130. After forming the source/drain regions 140, the dummy gate structures are replaced by the HKMG gate structures, and then a gate cut process (e.g., etching process) is performed to separate a continuous HKMG structure into discontinuous HKMG structures 111, 112, 113, and to separate another continuous HKMG structure into discontinuous HKMG structures 114, 115, and 116, as illustrated in FIG. 5A. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In some embodiments, each of the HKMG gate structures 111-116 includes a gate dielectric material GD and one or more gate metals GE. Exemplary gate dielectric materials include high-k dielectric such as, for example, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate metal(s) is formed over the gate dielectric. Exemplary gate metals GE includes, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN).

Figure 6:
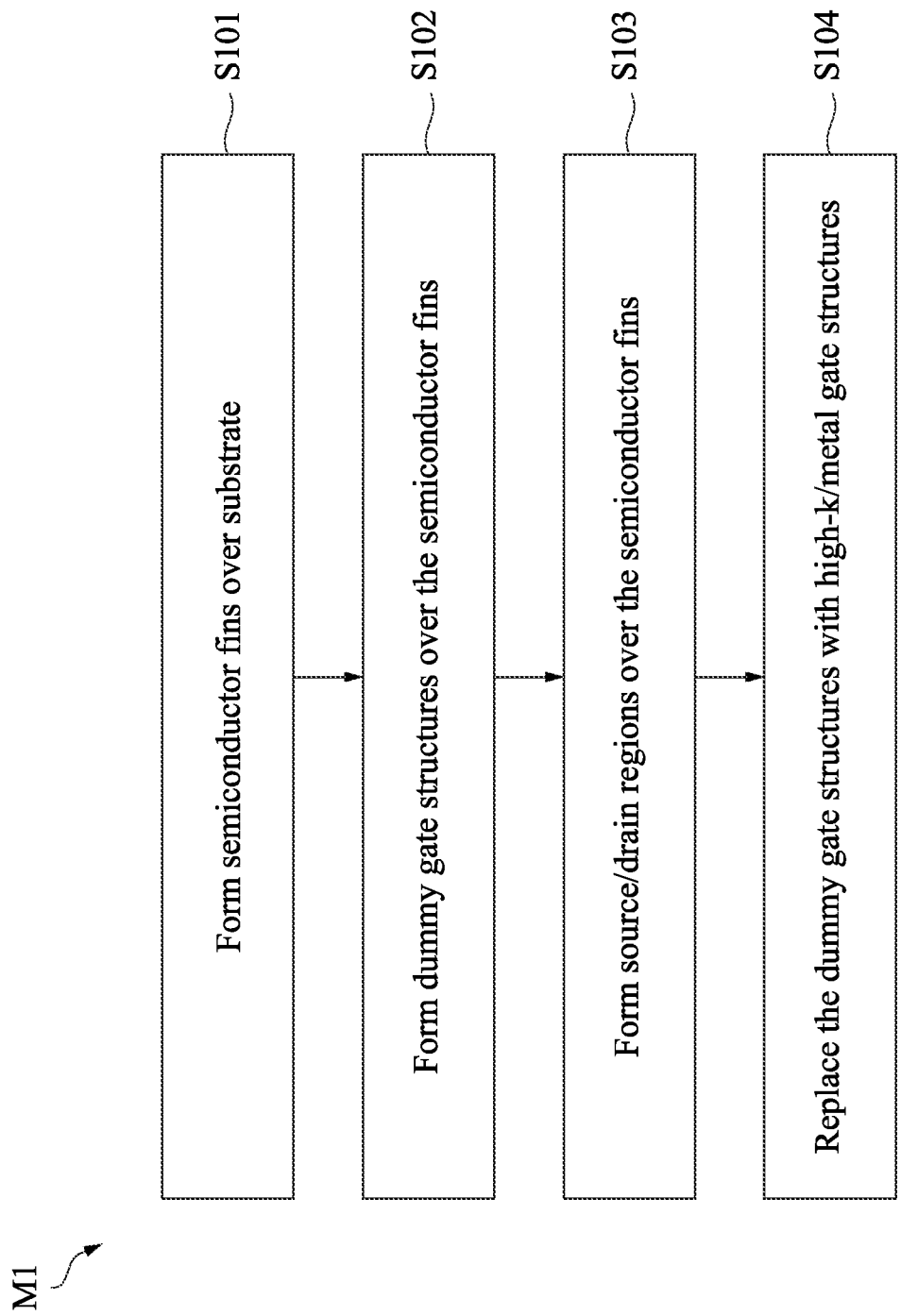
FIG. 6 is a flow chart illustrating a method of forming an SRAM cell in accordance with some embodiments.

FIG. 6 is a flow chart illustrating a method M1 of forming an SRAM cell in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, semiconductor fins are formed over a substrate. For example, NFET fins 101, 104 and PFET fins 102, 103 are formed over the substrate 105 by patterning the substrate 105.

At block S102, dummy gate structures are formed over the semiconductor fins. For example, the dummy gate structures are formed over the NFET fins 101, 104 and PFET fins 102, 103 to define channel regions of transistors PU1, PU2, PD1, PD2, PG1, PG2, WA1, and WA2.

At block S103, source/drain regions are formed over the semiconductor fins. For example, source/drain regions will be formed on portions of the NFET fins 101, 104 and PFET fins 102, 103 that are not covered by the dummy gate structures. The source/drain regions can serve as source/drain terminals of the transistors PU1, PU2, PD1, PD2, PG1, PG2, WA1, and WA2.

At block S104, the dummy gate structures are replaced with HKMG structures. For example, the dummy gate structures can be removed by using suitable etching processes, and then the HKMG structures are formed over the channel regions of the transistors PU1, PU2, PD1, PD2, PG1, PG2, WA1, and WA2, by using one or more depositions followed by a CMP process. In some embodiments, after forming HKMG structures, each continuous HKMG structure will be separated into discontinuous HKMG structures, such as the gate structures 111, 112, and 113 aligned with but separated from each other.

Figure 7:
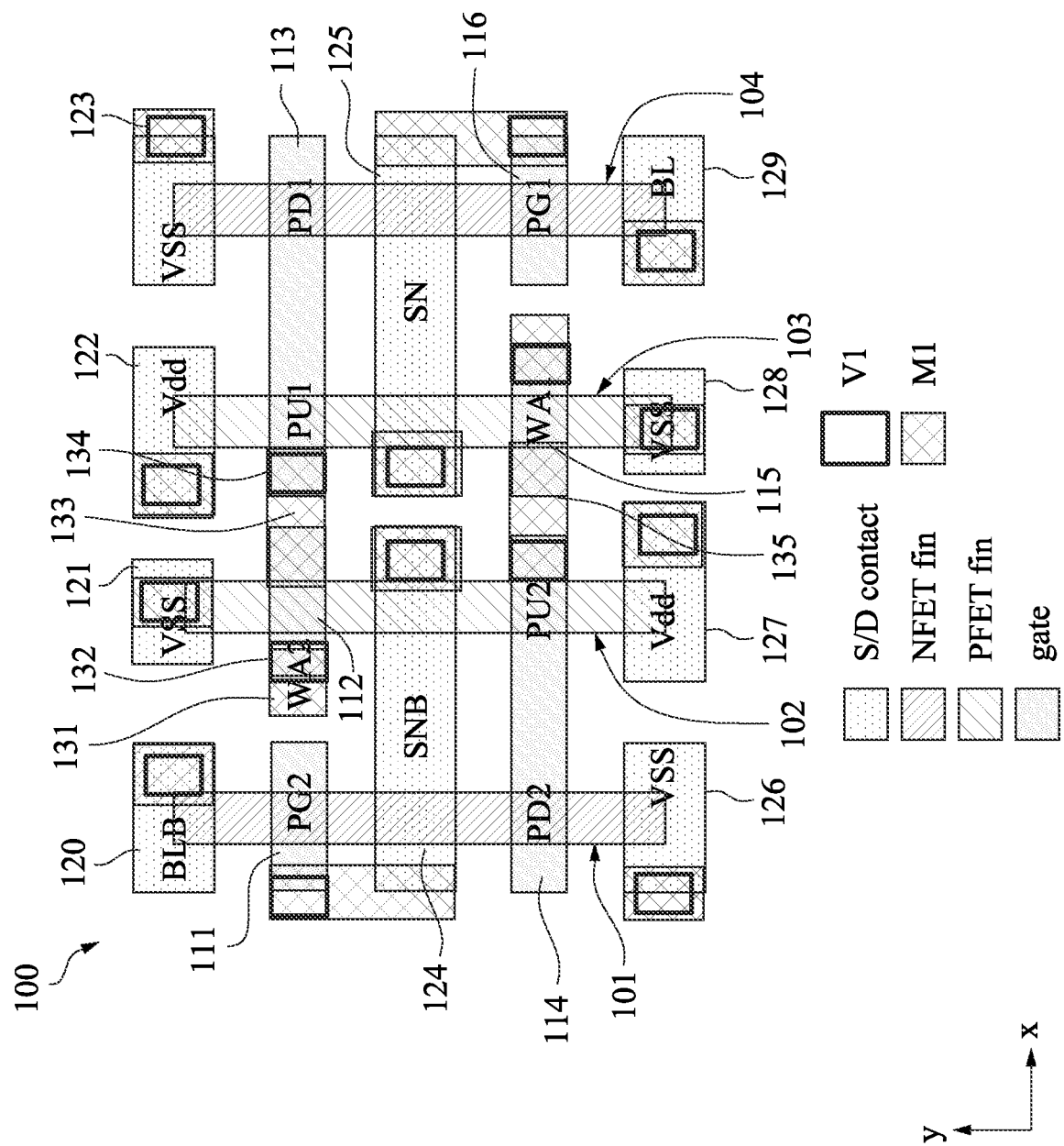
FIG. 7 depicts in a plan view an overlaid layout of an 8T SRAM cell in accordance with some embodiments of the present disclosure.

FIG. 7 depicts in a plan view an overlaid layout of the 8T SRAM cell 100, wherein the layout is an overlaid layout of various levels including the active region level L11, the gate region level L12, and an additional first metallization level L13. Layout patterns within the active region level L11 (e.g., fins 101-104) and layout patterns in the gate region level L12 (e.g., gate regions 111-116 and source/drain contact regions 120-129) are described previously with respect to FIGS. 5A-5D, and are thus not repeated for the sake of brevity. Layout patterns within the first metallization level L13 include first metal vias, labeled "V1," respectively over the gate regions 111-116 and source/drain contact regions 120-129, and first metal lines, labeled "M1," respectively over the first metal vias V1.

As illustrated in FIG. 7, the first metal lines M1 includes a first metal line 131 over the gate region 112 and a first metal line 133 over the gate region 113. The first metal line 131 extends in the x-direction and is coupled to the gate region 112 of the write-assist transistor WA2 by using a first metal via 132. A first metal line 133 extends in the x-direction and is coupled to the gate region 113 shared by the transistors PU1 and PD1 by using a first metal via 134. The first metal line 131 extends past a longitudinal end of the gate region 113 and a longitudinal end of the gate region 112 and thus overlaps with the gate regions 112, 113 from a plan view. Similarly, a first metal line 135 coupled to the gate region 114 shared by the transistors PU2, PD2 also overlaps with the gate region 115 of the write-assist transistor WA1 from a plan view.

Figure 8:
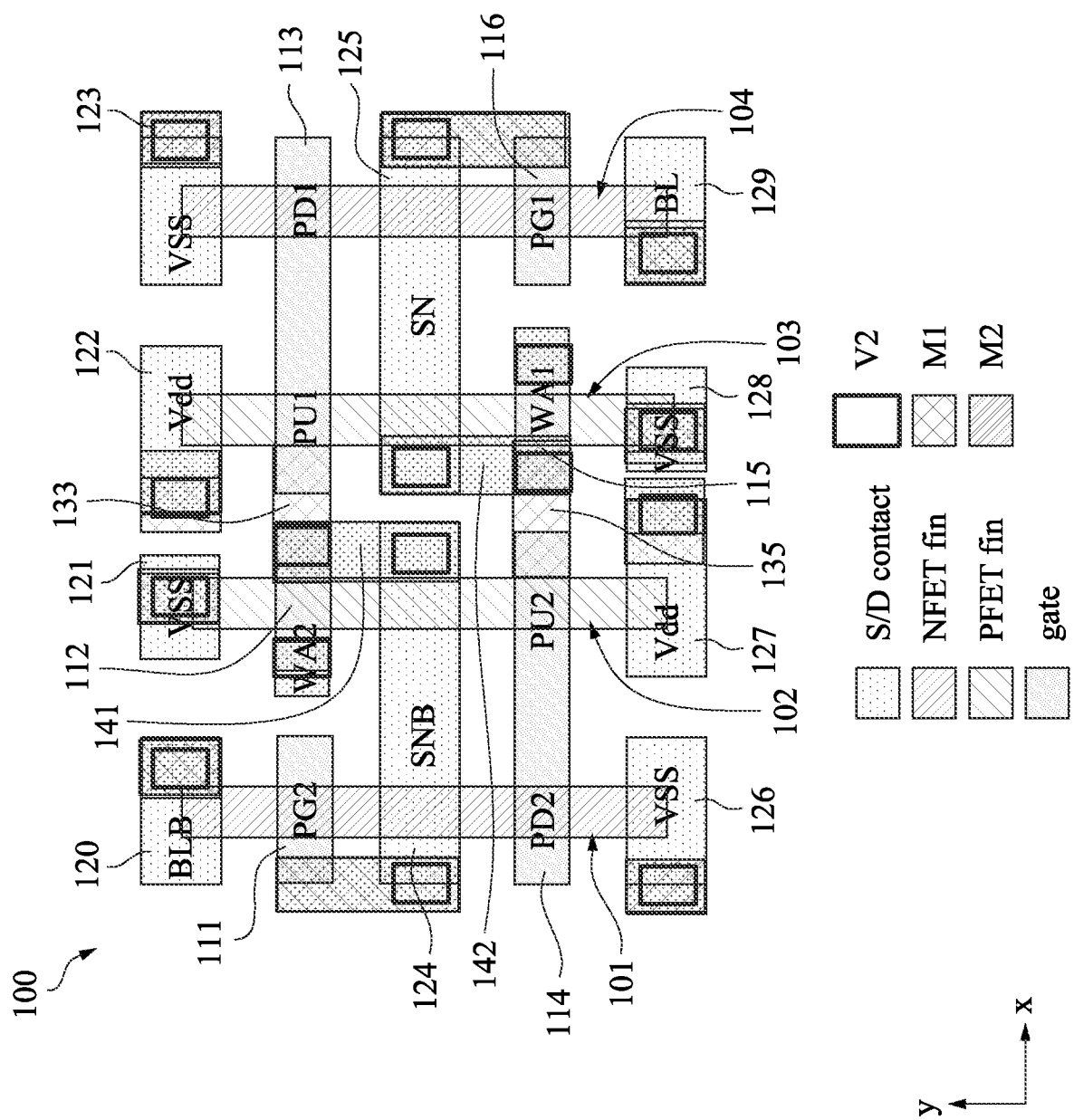
FIG. 8 depicts in a plan view an overlaid layout of an 8T SRAM cell in accordance with some embodiments of the present disclosure.

FIG. 8 depicts in a plan view an overlaid layout of the 8T SRAM cell 100, wherein the layout is an overlaid layout of various levels including the active region level L11, the gate region level L12, the first metallization level L13, and an additional second metallization level L14. Layout patterns within the active region level L11 (e.g., fins 101-104) and layout patterns in the gate region level L12 (e.g., gate regions 111-116 and source/drain contact regions 120-129) are described previously with respect to FIGS. 5A-5D, and are thus not repeated for the sake of brevity. Layout patterns within the first metallization level L13 (e.g., first metal lines M1 and first metal vias V1) are described previously with respect to FIG. 7, and thus are not repeated for the sake of brevity. Layout patterns within the second metallization level L14 include second metal vias, labeled "V2," respectively over the first metal lines M1, and second metal lines, labeled "M2," respectively over the second metal vias V2. The first metal vias V1 within the first metallization level L13 are skipped in this layout for the sake of clarity.

As illustrated in FIG. 8, the second metal lines M2 includes a second metal line 141 extending in the y-direction. The second metal line 141 includes a first end coupled to the gate region 113 shared by the transistors PU1, PD1 by using a second metal via V2 and the underlying first metal line 133. The second metal line 141 further includes a second end coupled to the storage node contact region 124 by using another second metal via V2. Therefore, input of an inverter formed of the transistors PU1, PD1 is coupled to the storage node SNB, which is output of another inverter formed of the transistors PU2, PD2. Similarly, the second metal lines M2 includes a second metal line 142 extending in the y-direction. The second metal line 142 includes a first end coupled to the gate region 114 shared by the transistors PU2, PD2 by using a second metal via V2 and the underlying first metal line 135. The second metal line 142 further includes a second end coupled to the storage node contact region 125 by using another second metal via V2. Therefore, input of the inverter formed of the transistors PU2, PD2 is coupled to the storage node SN, which is output of the inverter formed of the transistors PU1, PD1. By using the second metal lines 141, 142, the transistors PU1, PU2, PD1 and PD2 collectively form a cross coupled pair of CMOS inverters. The metal lines 141 and 142 can be thus interchangeably referred to as cross-coupled lines. As illustrated in FIG. 8, the cross-coupled line 141 may overlap a portion of the gate region 112 of the write-assist transistor WA2, and the cross-coupled line 142 may overlap a portion of the gate region 115 of the write-assist transistor WA1.

Figure 9:
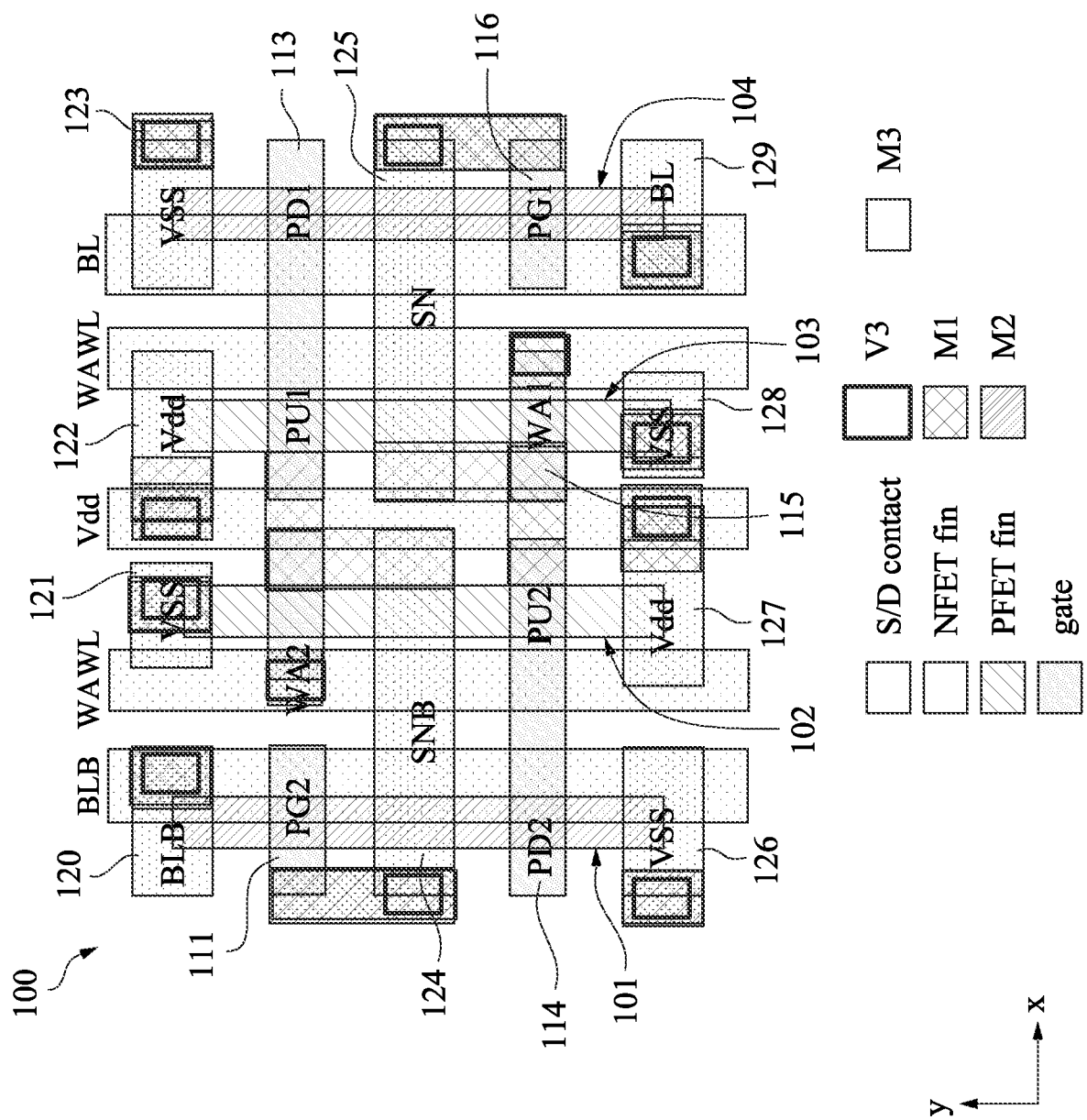
FIG. 9 depicts in a plan view an overlaid layout of an 8T SRAM cell in accordance with some embodiments of the present disclosure.

FIG. 9 depicts in a plan view an overlaid layout of the 8T SRAM cell 100, wherein the layout is an overlaid layout of various levels including the active region level L11, the gate region level L12, the first metallization level L13, the second metallization level L14, and an additional third metallization level L15. Layout patterns within the active region level L11 (e.g., fins 101-104) and layout patterns in the gate region level (e.g., gate regions 111-116 and source/drain contact regions 120-129) are described previously with respect to FIGS. 5A-5D, and are thus not repeated for the sake of brevity. Layout patterns within the first metallization level L13 (e.g., first metal lines M1 and first metal vias V1) are described previously with respect to FIG. 7, and thus are not repeated for the sake of brevity. Layout patterns within the second metallization level L14 (e.g., second metal lines M2 and second metal vias V2) are described previously with respect to FIG. 8, and thus are not repeated for the sake of brevity. Layout patterns within the third metallization level L15 include third metal vias, labeled "V3," respectively over the second metal lines M2, and third metal lines, labeled "M3," respectively over the third metal vias V3. The first metal vias V1 within the first metallization level L13 and the second metal vias V2 within the second metallization level L14 are skipped in this layout for the sake of clarity.

As illustrated in FIG. 9, the third metal lines M3 include bit lines BL, BLB, a power supply line Vdd, and write-assist word lines WAWL extending in the y-direction. Write-assist word lines WAWL are respectively coupled to gate regions of the write-assist transistors WA1, WA2 by using third metal vias V3 that respectively overlap the gate regions of the write-assist transistors WA1, WA2. The bit lines BL, BLB are respectively coupled to the bit line contact regions 129, 120 by using third metal vias V3 that respectively overlap the bit line contact regions 129, 120. The power supply line Vdd is coupled to the Vdd contact regions 122 and 127 by using third metal vias V3 that respectively overlap the Vdd contact regions 122 and 127.

Figure 10A:
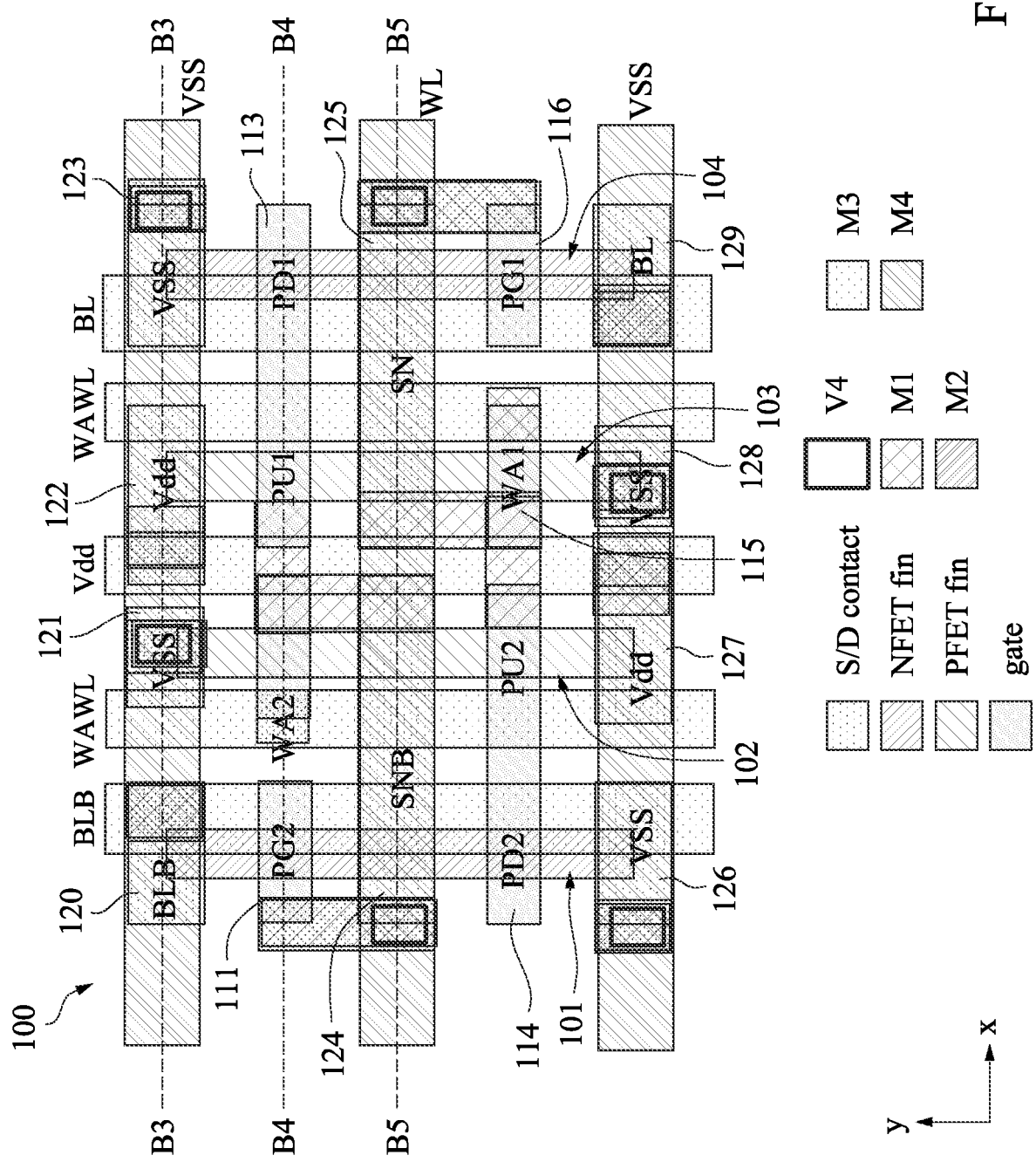
FIG. 10A depicts in a plan view an overlaid layout of an 8T SRAM cell in accordance with some embodiments of the present disclosure.
Figure 10B:
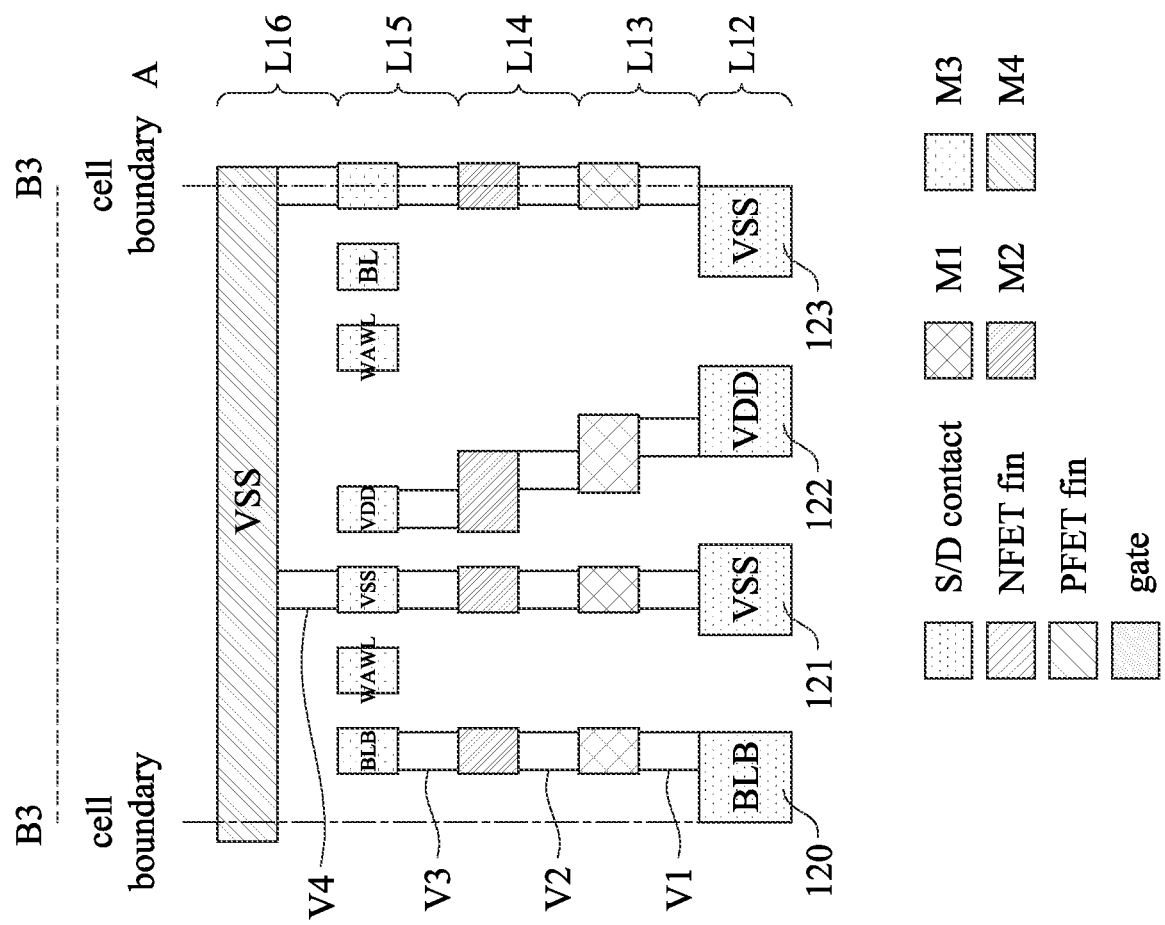
FIG. 10B is a cross-sectional view of the 8T SRAM cell along the cross-section B3-B3 in FIG. 10A.
Figure 10C:
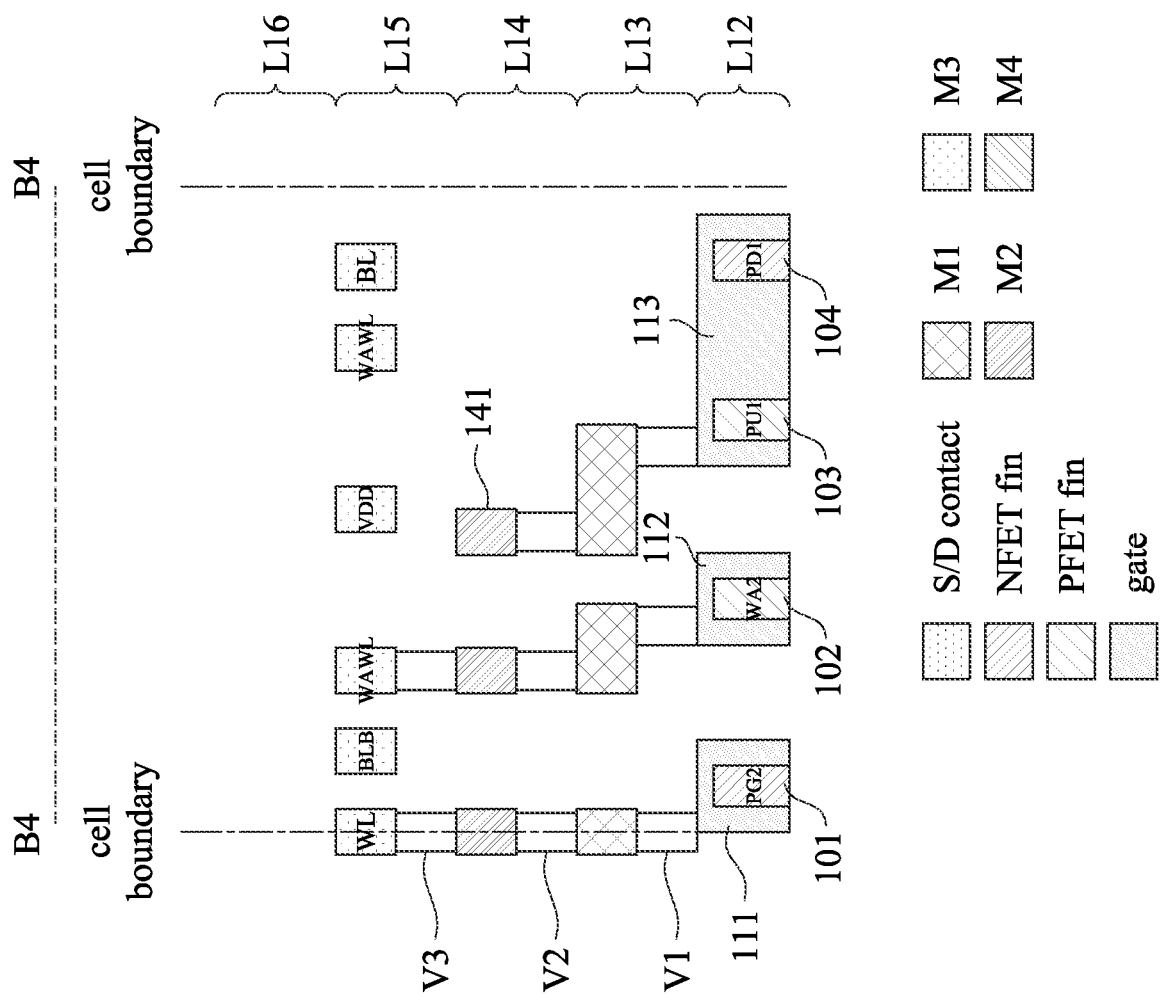
FIG. 10C is a cross-sectional view of the ST SRAM cell along the cross-section B4-B4 in FIG. 10A.
Figure 10D:
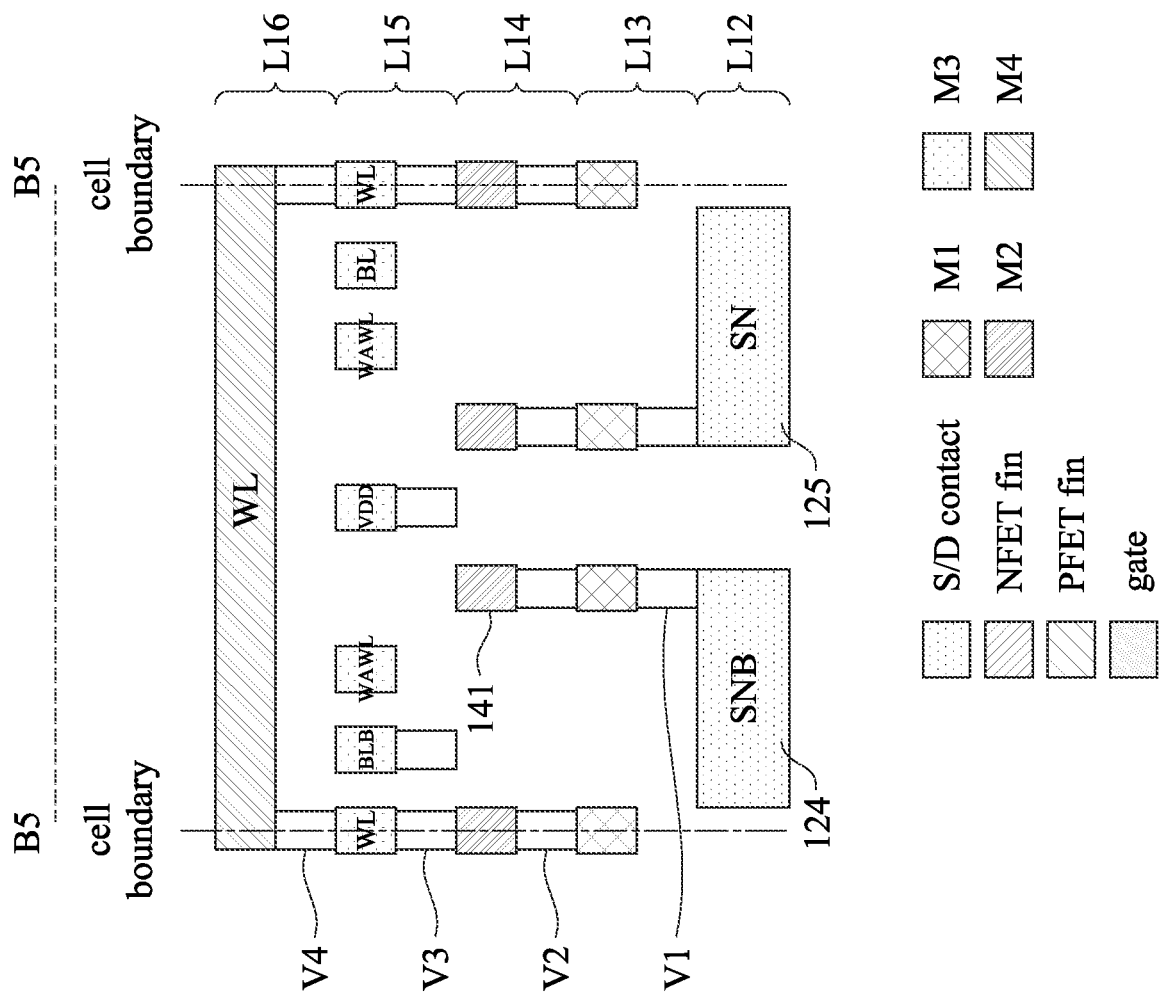
FIG. 10D is a cross-sectional view of the ST SRAM cell along the cross-section B5-B5 in FIG. 10A.

FIG. 10A depicts in a plan view an overlaid layout of the 8T SRAM cell 100. FIG. 10B is a cross-sectional view of the 8T SRAM cell 100 along the cross-section B3-B3. FIG. 10C is a cross-sectional view of the 8T SRAM cell 100 along the cross-section B4-B4. FIG. 10D is a cross-sectional view of the 8T SRAM cell 100 along the cross-section B5-B5.

The layout illustrated in FIG. 10A is an overlaid layout of various levels including the active region level L11, the gate region level L12, the first metallization level L13, the second metallization level L14, the third metallization level L15, and an additional fourth metallization level L16. Layout patterns within the active region level L11 (e.g., fins 101-104) and layout patterns in the gate region level (e.g., gate regions 111-116 and source/drain contact regions 120-129) are described previously with respect to FIGS. 5A-5D, and are thus not repeated for the sake of brevity. Layout patterns within the first metallization level L13 (e.g., first metal lines M1 and first metal vias V1), layout patterns within the second metallization level L14 (e.g., second metal lines M2 and second metal vias V2), and layout patterns within the third metallization level L15 (e.g., third metal lines M3 and third metal vias V3) are described previously with respect to FIGS. 7-9, and thus are not repeated for the sake of brevity. Layout patterns within the fourth metallization level L16 include fourth metal vias, labeled "V4," respectively over the third metal lines M3, and fourth metal lines, labeled "M4," respectively over the fourth metal vias V4. The first metal vias V1 within the first metallization level L13, the second metal vias V2 within the second metallization level L14, and the third metal vias V3 within the third metallization level L15 are skipped in this layout for the sake of clarity.

As illustrated in FIG. 10A-IOC, the fourth metal lines M4 includes a word line WL, and power supply lines Vss extending in the x-direction. The word line WL is coupled to the pass-gate transistors PG1 and PG2 using at least the fourth metal vias V4. An upper power supply lines Vss is coupled to the Vss contact regions 121 and 123 by using at least the fourth metal vias V4 that respectively overlap the Vss contact regions 121 and 123. A lower power supply line Vss is coupled to the Vss contact regions 126 and 128 by using at least the fourth metal vias V4 that respectively overlap the Vss contact regions 126 and 128.

FIGS. 10B-10D illustrate relationship in cross-sectional views among the active region level L11, the gate region level L12, the first metallization level L13, the second metallization level L14, the third metallization level L15, and the fourth metallization level L16. As illustrated in FIGS. 10B-10D, the first metallization level L13 is a next level above the gate region level L12, and includes first metal vias V1 and first metal lines M1 coupled to the source/drain contact regions (e.g., regions 120-123 illustrated in FIG. 10B, regions 124-125 illustrated in FIG. 10D) and gate regions (e.g., regions 111-113 illustrated in FIG. 10C) by using the first metal vias V1. The second metallization level L14 is a next level above the first metallization level L13, and includes second metal vias V2 and second metal lines M2 over the second metal vias V2. The second metal lines M2 includes a cross-coupled line 141 coupling the shared gate region 113 of transistors PU1, PD1 to the storage node SNB. The third metallization level L15 is a next level above the second metallization level L14, and includes third metal lines M3 extending in the y-direction. The fourth metallization level L16 is a next level above the third metallization level L15, and includes fourth metal lines M4 extending in the x-direction.

Because the write-assist word lines WAWL extend in the y-direction within the third metallization level L15, and the word lines WL extend in the x-direction within the fourth metallization level L16, a target SRAM cell in a large array of SRAM cells can be precisely selected by using the column-wise write-assist word lines WAWL and the row-wise word lines WL, which in turn aids in mitigating the half select disturbance issue for the SRAM array.

Figure 11:
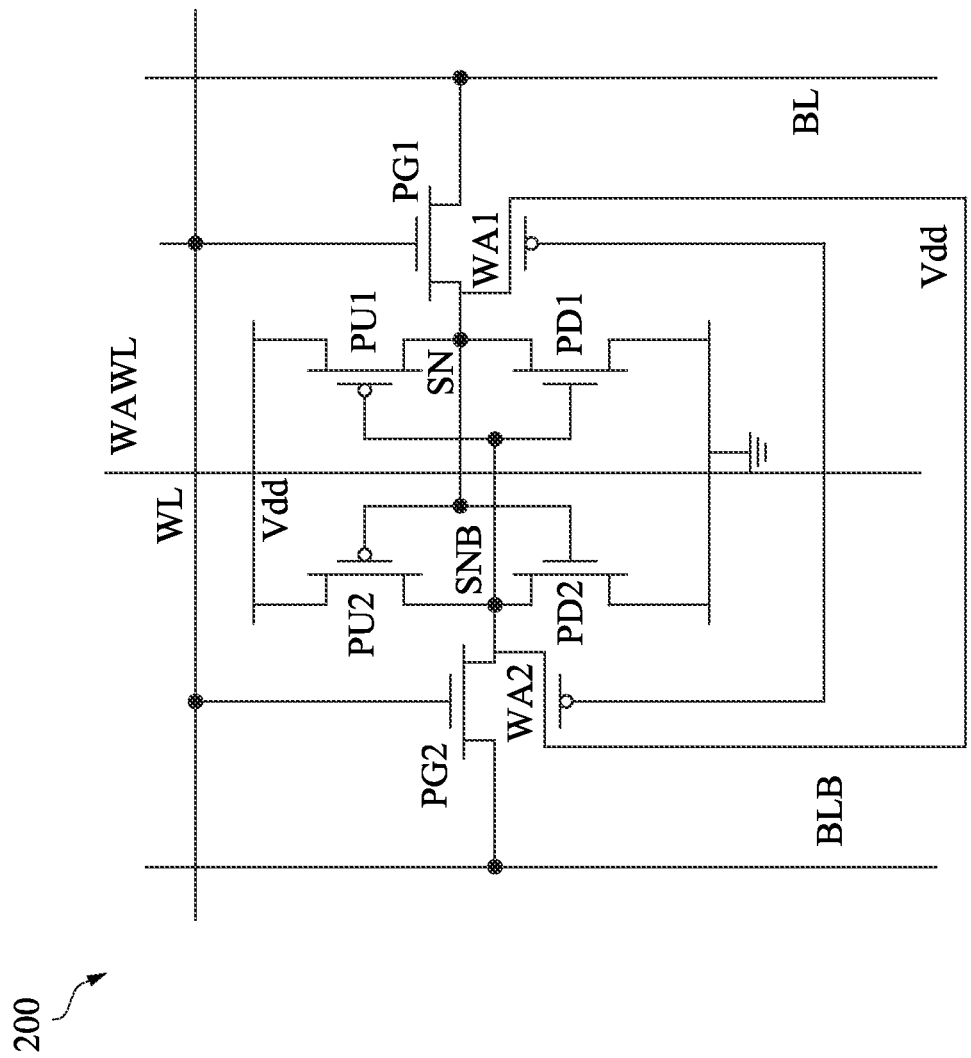
FIG. 11 illustrates a circuit diagram of an 8T SRAM cell in accordance with some embodiments of the present disclosure.

FIG. 11 illustrates a circuit diagram of an 8T SRAM cell 200 in accordance with some embodiments of the present disclosure. The circuit diagram of 8T SRAM cell 200 is substantially same as that of the 8T SRAM cell 100 as shown in FIG. 1, except that the 8T SRAM cell 200 includes the write-assist transistors WA1 and WA2 coupled to the cell positive voltage supply Vdd, instead of coupled to Vss.

During a write operation to write a new data logic "0" into the SRAM cell, the word line WL is activated (i.e., a logic one or "high" voltage) and thus turn on the pass-gate transistors PG1 and PG2, the storage node SN of the data latch is discharged by the bit line BL to "0" and the other storage node of the data latch is charged by the bit line BLB to "1". As a result, the new data logic "0" is latched into the SRAM cell 200. Meanwhile, during the write operation, the write-assist word line WAWL turns on the write-assist transistors WA1 and WA2. The turned-on write-assist transistor WA2, which is coupled to Vdd, charges the storage node SNB, together with the charging of the storage node SNB by the pass-gate transistor PG2. Therefore, the speed and efficiency of the write operation can be improved.

In a different write operation to write data logic "1" into the SRAM cell 200, a logic state "0" stored in a data latch of the SRAM cell 200 can be reset by setting the bit line BL to "1" and the bit line BLB to "0." In such a write operation, the storage node SN of the data latch is charged by the bit line BL to "1" and the other storage node SNB of the data latch is discharged by the bit line BLB to "0". As a result, the new data logic "1" is latched into the SRAM cell 200. Meanwhile, during the write operation, the write-assist word line WAWL turns on the write-assist transistors WA1 and WA2. The turned-on write-assist transistor WA1, which is coupled to Vdd, charges the storage node SN, together with the charging of the storage node SN by the pass-gate transistor PG1. Therefore, the speed and efficiency of the write operation can be improved.

Figure 12:
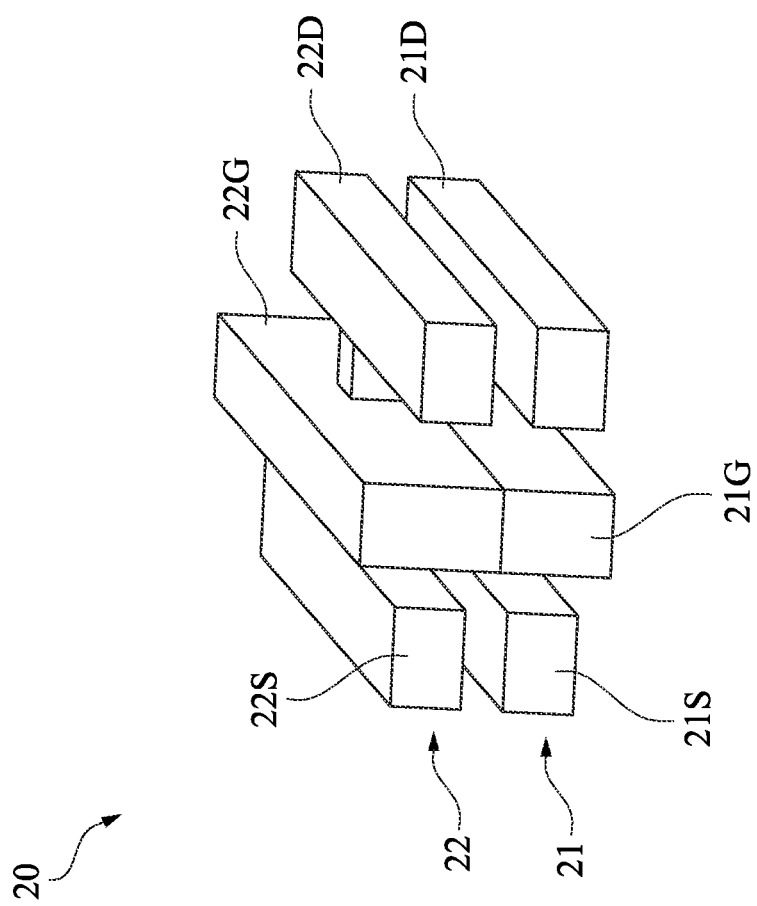
FIG. 12 illustrates an example of a CFET in a perspective view.

In some embodiments, the SRAM cell structure includes a plurality of complementary FET (CFET) devices each including a p-type FET and an n-type FET that are vertically stacked. As shown in FIG. 12, in a CFET, a first transistor 21 is disposed over a substrate, and a second transistor 22 is disposed above the first transistor 21. The first transistor 21 includes a first source 21S, a first drain 21D, and a first gate 21G between the first source 21S and the first drain 21D. The second transistor 22 includes a second source 22S, the second drain 22D, and a second gate 22G between the second source 22S and the second drain 22D. The source/drain of the first transistor is separated from the source/drain of the second transistor in some embodiments. The gate of the first transistor is separated from the gate of the second transistor in some embodiments. The first gate structure 21G includes a gate dielectric layer and a gate electrode layer formed around the channel region of the first transistor 21. The second gate structure 22G includes a gate dielectric layer and a gate electrode layer formed around the channel region of the second transistor 22. In some embodiments, the first transistor 21 is a first conductivity type (e.g., n-type) FET and the second transistor 22 is a second conductivity type (e.g., p-type) different from the first conductivity type. In some embodiments, the transistors 21, 22 are gate-all-around (GAA) FETs.

Figure 13:
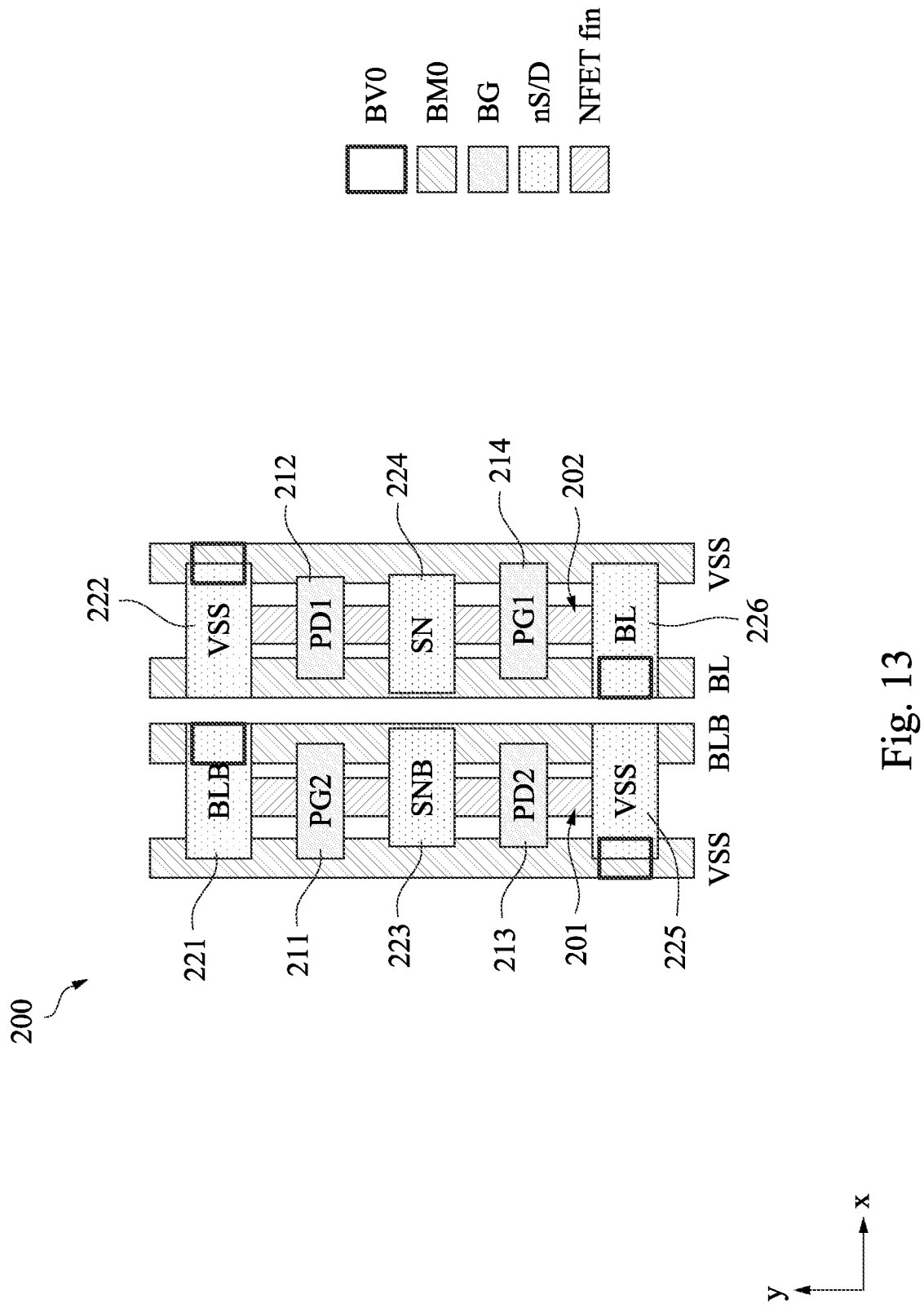
FIG. 13 depicts in a plan view a layout of an 8T SRAM cell in accordance with some embodiments of the present disclosure.
Figure 14A:
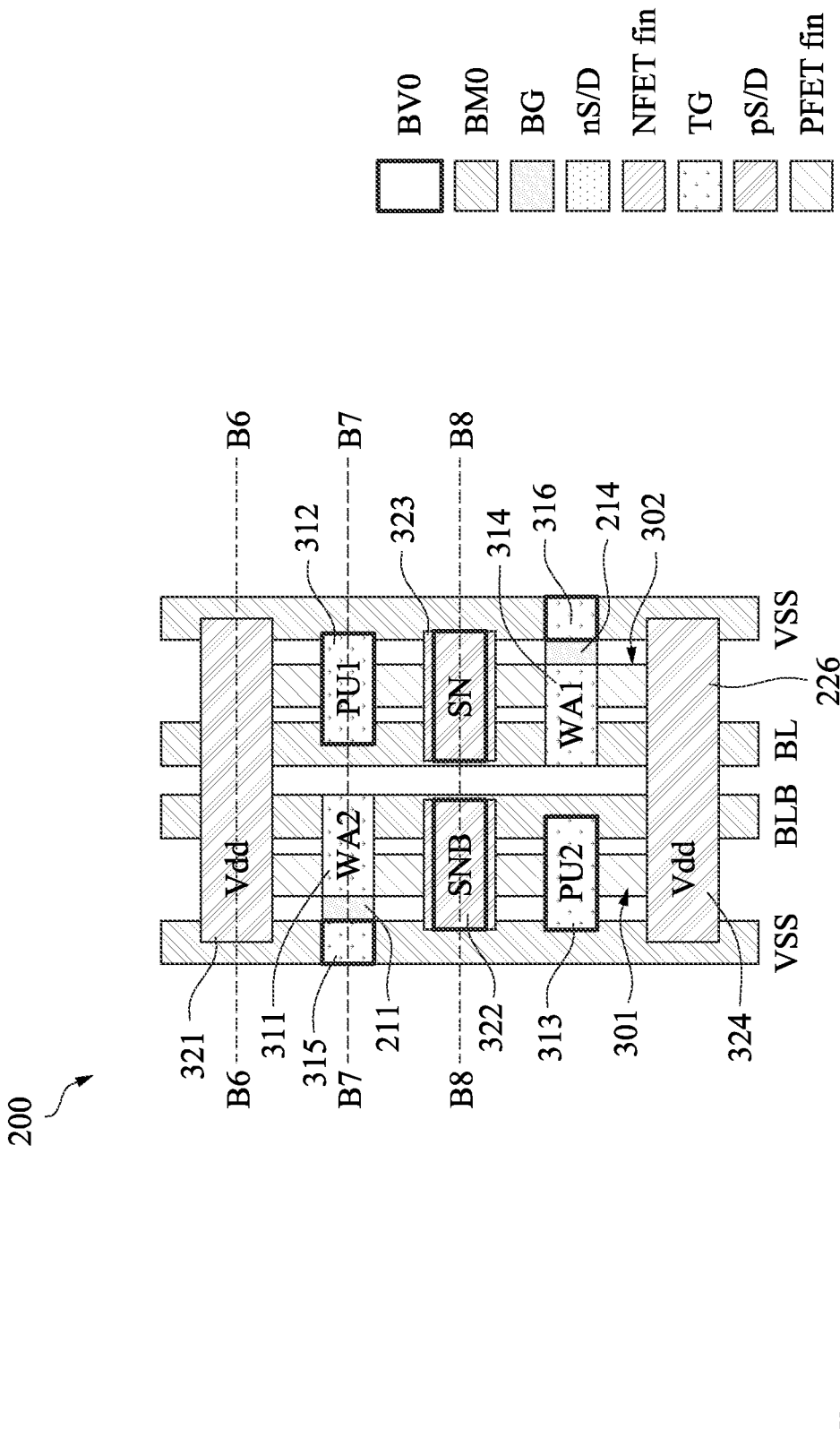
FIG. 14A depicts in a plan view a layout of an 8T SRAM cell in accordance with some embodiments of the present disclosure.
Figure 14B:
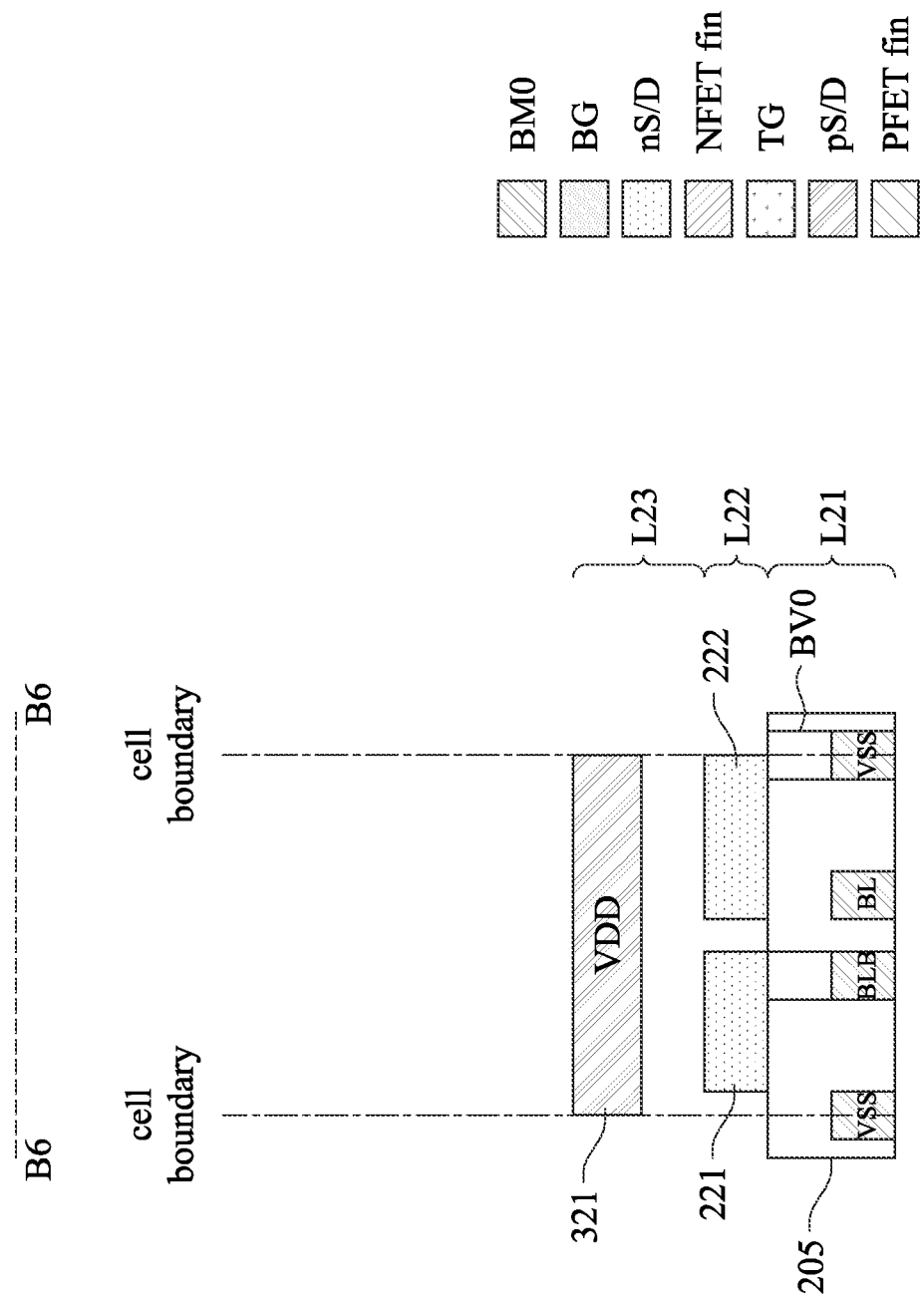
FIG. 14B is a cross-sectional view of the 8T SRAM cell along the cross-section B6-B6 in FIG. 14A.
Figure 14C:
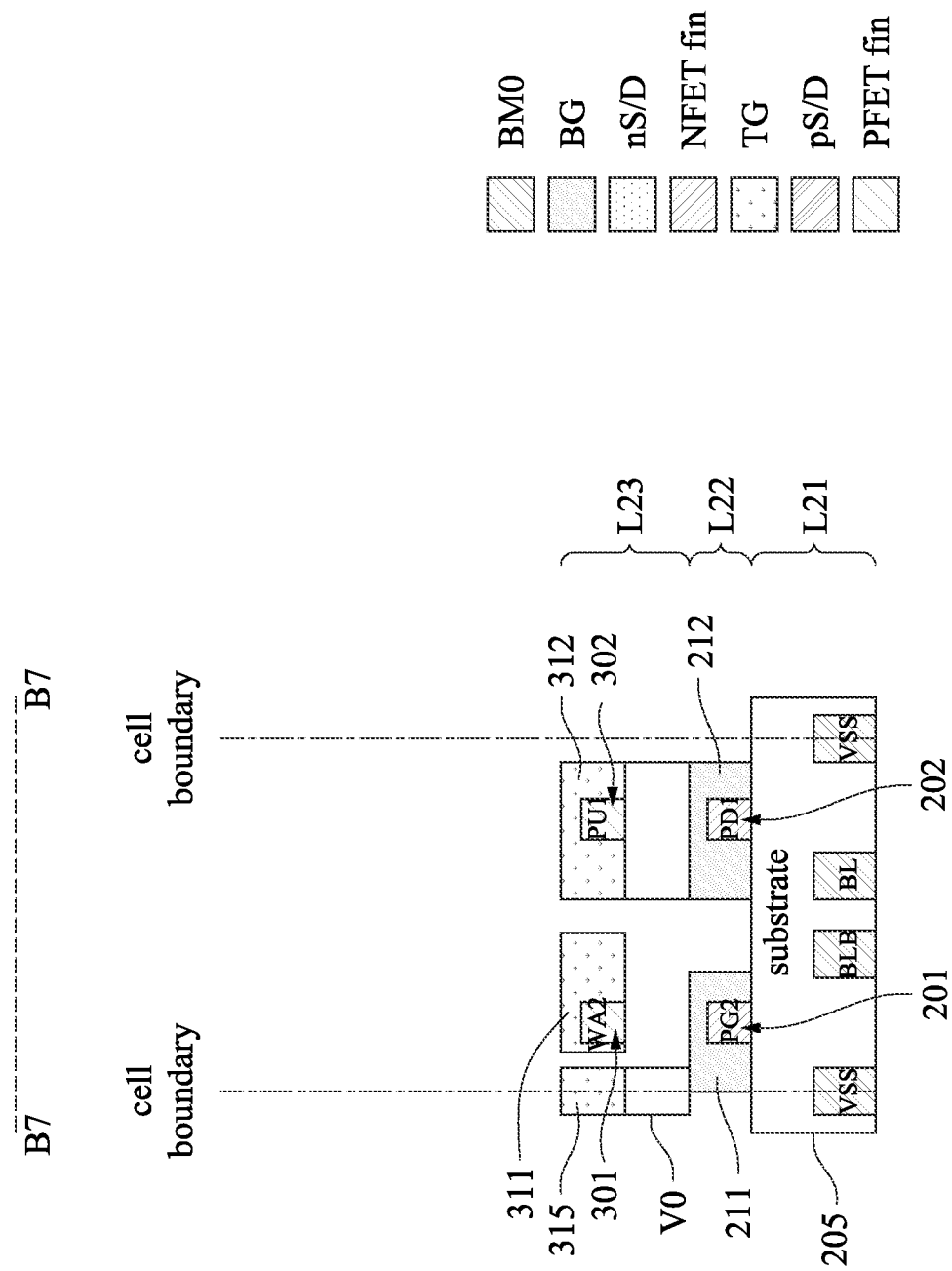
FIG. 14C is a cross-sectional view of the 8T SRAM cell along the cross-section B7-B7 in FIG. 14A.
Figure 14D:
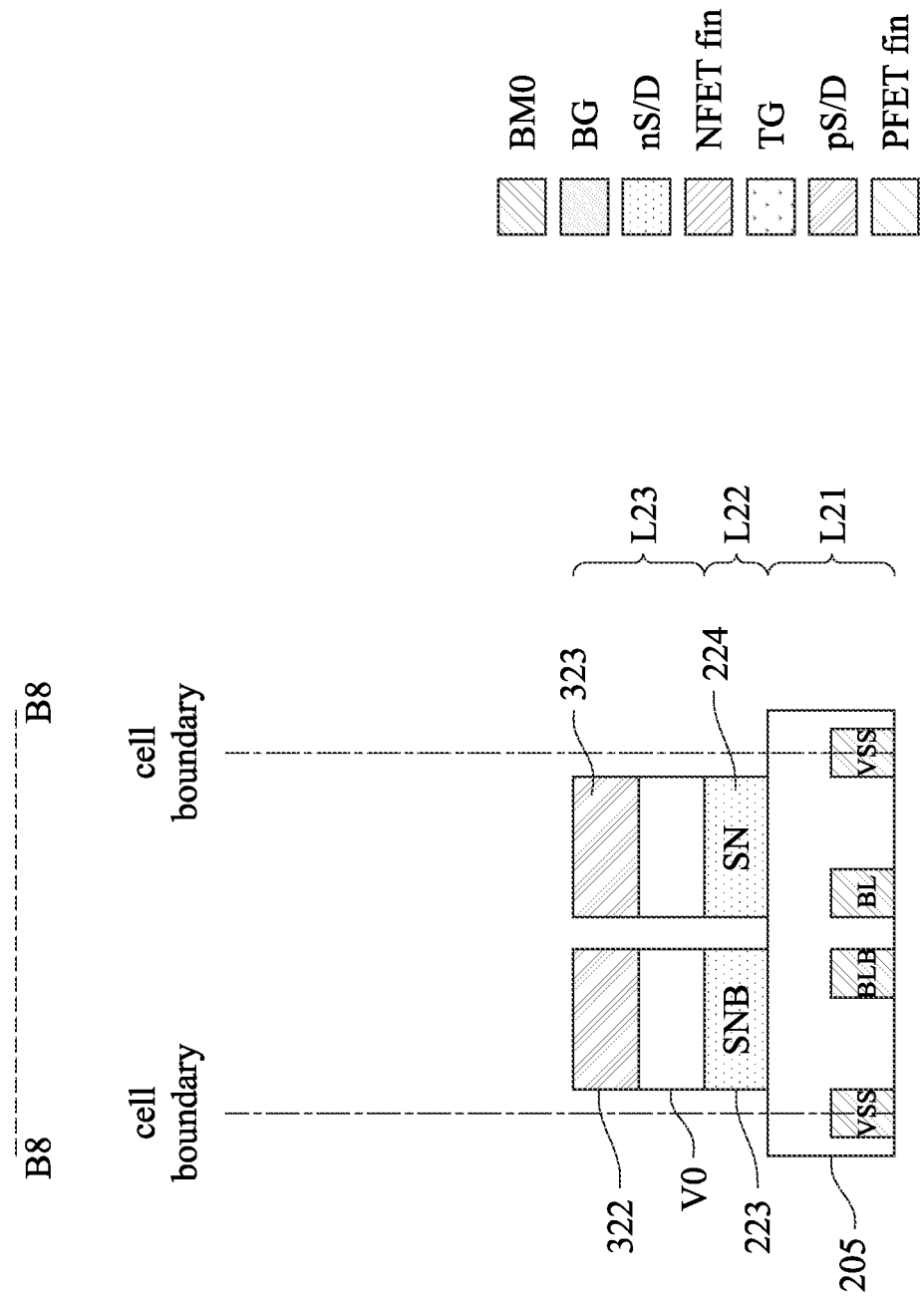
FIG. 14D is a cross-sectional view of the ST SRAM cell along the cross-section B8-B8 in FIG. 14A.

FIG. 13 depicts in a plan view a layout of an 8T SRAM cell 200 in accordance with some embodiments of the present disclosure. The layout in FIG. 13 is an overlaid layout of various levels including a substrate level L21 and a bottom transistor level L22. FIG. 14A depicts in a plan view a layout of the 8T SRAM cell 200 in accordance with some embodiments of the present disclosure. The layout in FIG. 14A is an overlaid layout of various levels including the substrate level L21, the bottom transistor level L22, and an additional top transistor level L23. FIG. 14B is a cross-sectional view of the 8T SRAM cell 200 along the cross-section B6-B6, which is obtained from source/drain terminals of the pass-gate transistor PG2, write-assist transistor WA2, pull-up transistor PU1 and pull-down transistor PD1, and extends along longitudinal axes of gates of the pass-gate transistor PG2, write-assist transistor WA2, pull-up transistor PU1 and pull-down transistor PD2. FIG. 14C is a cross-sectional view of the 8T SRAM cell 200 along the cross-section B7-B7, which is obtained from gates of transistors PG2, WA2, PU1 and PD1, and extends along longitudinal axes of gates of transistors PG2, WA2, PU1 and PD1. FIG. 14D is a cross-sectional view of the 8T SRAM cell 200 along the cross-section B8-B8, which is obtained from other source/drain terminals of transistors PG2, WA2, PU1 and PD1, and extends along longitudinal axes of gates of transistors PG2, WA2, PU1 and PD1.

As illustrated in FIG. 13, the SRAM cell 200 may include two bottom active regions, labeled "NFET fin," in the bottom transistor level L22, each of which is formed by a fin, a nanowire, or a nanosheet. Fins in the bottom transistor level L22 are numbered 201 and 202 and are each a semiconductor fin. The bottom fins 201-202 extend parallel in a y-direction shown in FIG. 13 across the cell height of the SRAM cell 200. Fins 201-202 serve to form n-type transistors (NFETs), such as pass-gate transistors PG1, PG2, and pull-down transistors PD1, PD2. In some embodiments, the pass-gate transistor PG2 and the pull-down transistor PD2 share a same NFET fin 201, and the pass-gate transistor PG1 and the pull-down transistor PD1 share a same NFET fin 202.

FIG. 13 further illustrates bottom gate regions, labeled "BG," in the bottom transistor level L22. Bottom gate regions are numbered 211, 212, 213, and 214 and each may be a high-k/metal gate (HKMG) structure comprising one or more dielectric layers (including high-k dielectric) and one or more metal layers over the one or more dielectric layers. The gate regions extend parallel in the x-direction shown in FIG. 13 along the cell width of the SRAM cell 200. In addition, the fins are orthogonal to the gate regions in the layout diagram. A bottom transistor is formed at a cross point of a bottom fin and a bottom gate region. As shown in FIG. 13, four bottom transistors of the SRAM cell 200 are formed at different cross points. In particular, the pass-gate transistor PG2 is formed at the cross point of the NFET fin 201 and the gate region 211, the pull-down transistor PD2 is formed at the cross point of the NFET fin 201 and the gate region 213, the pull-down transistor PD1 is formed at the cross point of the NFET fin 202 and the gate region 212, and the pass-gate transistor PG1 is formed at the cross point of the NFET fin 202 and the gate region 214.

FIG. 13 further illustrates six bottom source/drain contact regions, labeled "nS/D." Source/drain contact regions are numbered 221, 222, 223, 224, 225, and 226, and each contact region includes one or more metal materials in a contact opening formed in dielectric layer, and will provide a vertical connection to metals at different levels. The contact region 223 serves as a bottom contact of storage node SNB that is shared by the pass-gate transistor PG2 and the pull-down transistor PD2, coupling together a source/drain terminal of the pass-gate transistor PG2 with a source/drain terminal of the pull-down transistor PD2. The contact region 224 serves as a bottom contact of storage node SN that is shared by the pass-gate transistor PG1 and the pull-down transistor PD1, coupling together a source/drain terminal of the pass-gate transistor PG1 with a source/drain terminal of the pull-down transistor PD1.

FIG. 13 further illustrates buried metal lines labeled "BM0." The buried metal lines BM0 are buried in substrate 205 and thus located below the bottom transistors PG1, PG2, PD1 and PD2, as illustrated in the cross-sectional views of FIGS. 14B-14D. The buried metal lines BM0 include power supply lines Vss, and bit lines BL, BLB laterally between the power supply lines Vss. Source/drain contact region 222 is coupled to a power supply line Vss by using a buried metal via labeled "BV0," and thus a source/drain terminal of the pull-down transistor PD1 is coupled to Vss. Source/drain contact region 225 is coupled to another power supply line Vss by using another buried metal via BV0, and thus a source/drain terminal of the pull-down transistor PD2 is coupled to Vss. The contact regions 222 and 225 can be interchangeably referred to as Vss contacts. Source/drain contact region 221 is coupled to the bit line BLB by using a buried metal via BV0, and thus a source/drain terminal of the pass-gate transistor PG2 is coupled to the bit line BLB. Source/drain contact region 226 is coupled to the bit line BL by using a buried metal via BV0, and thus a source/drain terminal of the pass-gate transistor PG1 is coupled to the bit line BL. The contact regions 221 and 226 can be interchangeably referred to as bit line contact regions.

As illustrated in FIG. 14A, the SRAM cell 200 may include two top active regions, labeled "PFET fin," in the top transistor level L23, each of which is formed by a fin, a nanowire, or a nanosheet. Fins in the top transistor level L23 are numbered 301 and 302 and are each a semiconductor fin. The top fins 301-302 extend parallel in a y-direction shown in FIG. 14A across the cell height of the SRAM cell 200. Fins 301-302 serve to form p-type transistors (PFETs), such as write-assist transistors WA1, WA2, and pull-up transistors PU1, PU2. In some embodiments, the pull-up transistor PU2 and the write-assist transistor WA2 share a same PFET fin 301, and the pull-up transistor PU1 and the write-assist transistor WA1 share a same PFET fin 302. Therefore, integrating the write-assist transistors WA1 and WA2 into the SRAM cell 200 will cause no footprint increase in the SRAM cell 200.

FIG. 14A further illustrates top gate regions, labeled "TG," in the top transistor level L23. Top gate regions include functional gate regions that are numbered 311, 312, 313, and 314 and each may be a high-k/metal gate (HKMG) structure comprising one or more dielectric layers (including high-k dielectric) and one or more metal layers over the one or more dielectric layers. The top gate regions 311-314 extend parallel in the x-direction shown in FIG. 14A along the cell width of the SRAM cell 200. In addition, the fins are orthogonal to the gate regions in the layout diagram. A top transistor is formed at a cross point of a top fin and a top gate region. As shown in FIG. 14A, four top transistors of the SRAM cell 200 are formed at different cross points. In particular, the write-assist transistor WA2 is formed at the cross point of the PFET fin 301 and the gate region 311, the pull-up transistor PU2 is formed at the cross point of the PFET fin 301 and the gate region 313, the write-assist transistor WA1 is formed at the cross point of the PFET fin 302 and the gate region 314, and the pull-up transistor PU1 is formed at the cross point of the PFET fin 302 and the gate region 312.

The top gate region 312 is coupled to the bottom gate region 212 by using an inter-transistor via V0 that extends from a top transistor to an underlying bottom transistor, so that the gate terminal of the pull-up transistor PU1 is coupled to the gate terminal of the pull-down transistor PD. The top gate region 313 is coupled to the bottom gate region 213 by using an inter-transistor via V0 that extends from a top transistor to an underlying bottom transistor, so that the gate terminal of the pull-up transistor PU2 is coupled to the gate terminal of the pull-down transistor PD2.

The top gate regions further comprise non-functional gate regions 315, 316, which are formed of same materials as the functional gate regions 311-314 but do not serve as functional gates for controlling current flow in the PFET fins 301, 302. Instead, the non-functional gate region 315 is coupled to the underlying bottom gate region 211 by using an inter-transistor via V0 that extends from a top transistor to an underlying bottom transistor, and the non-functional gate region 316 is coupled to the underlying bottom gate region 214 by using another inter-transistor via V0. The non-functional gate regions 315, 316 serve for a conductive path for coupling gate terminals of pass-gate transistors PG2, PG1 to word lines in an upper metallization level.

FIG. 14A further illustrates four top source/drain contact regions, labeled "pS/D." Top source/drain contact regions are numbered 321, 322, 323, and 324, and each contact region includes one or more metal materials in a contact opening formed in dielectric layer, and will provide a vertical connection to metals at different levels. The top source/drain contact regions also provide local interconnections between devices within a same level, for example a source/drain terminal of the write-assist transistor WA2 is coupled to a source/drain terminal of the pull-up transistor PU1 by using the contact region 321, and a source/drain terminal of the write-assist transistor WA1 is coupled to a source/drain terminal of the pull-up transistor PU2 by using the contact region 324. The contact regions 321 and 324 are electrically coupled to Vdd supply by using interconnect vias and metal lines in one or more upper metallization levels (not shown in FIG. 14A), and thus these contact region 321 and 324 can be interchangeably referred to as Vdd contacts.

The contact region 322 serves as a top contact of storage node SNB that is shared by the write-assist transistor WA2 and the pull-up transistor PU2, coupling together a source/drain terminal of the write-assist transistor WA2 and the pull-up transistor PU2. Moreover, the top contact region 322 is coupled to the bottom contact region 223 by using an inter-transistor via V0, thereby coupling together source/drain terminals of transistors WA2, PU2, PG2 and PD2.

The contact region 323 serves as a top contact of storage node SN that is shared by the write-assist transistor WA1 and the pull-up transistor PU1, coupling together a source/drain terminal of the write-assist transistor WA1 and the pull-up transistor PU1. Moreover, the top contact region 323 is coupled to the bottom contact region 224 by using an inter-transistor via V0, thereby coupling together source/drain terminals of transistors WA1, PU1, PG1 and PD1.

The write-assist transistor WA1 has a first source/drain terminal coupled to Vdd by using the Vdd contact 324, and a second source/drain terminal coupled to the storage node SN by using the storage node contact 323. The write-assist transistor WA2 has a first source/drain terminal coupled to Vdd by using the Vdd contact 321, and a second source/drain terminal coupled to the storage node SNB by using the storage node contact 322. The write-assist transistors WA1, WA2 can thus shorten the write time of the SRAM cell 200, as discussed previously with respect to FIG. 11.

Figure 15:
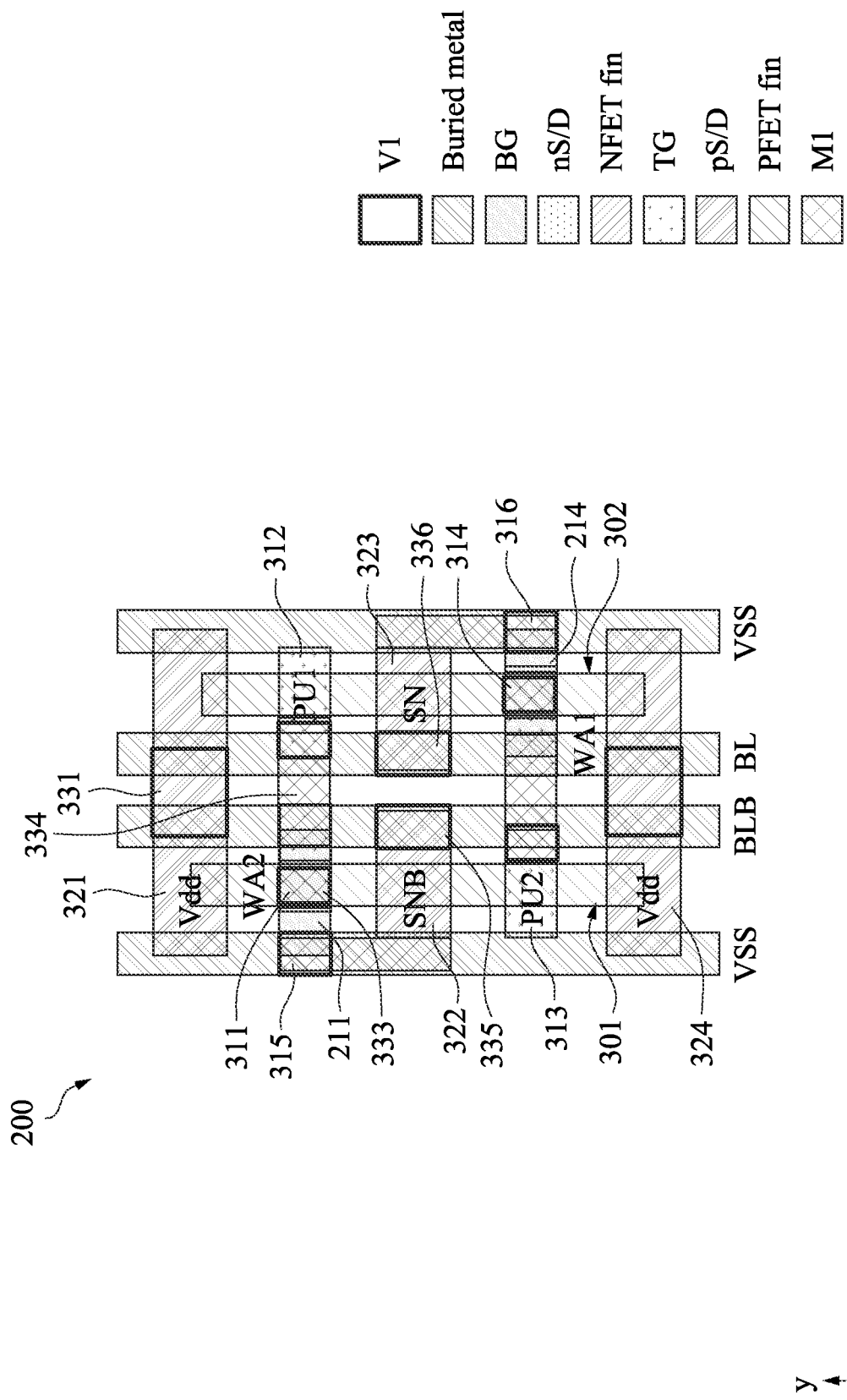
FIG. 15 depicts in a plan view a layout of an ST SRAM cell in accordance with some embodiments of the present disclosure.

FIG. 15 depicts in a plan view an overlaid layout of the 8T SRAM cell 200, wherein the layout is an overlaid layout of various levels including the substrate level L21, bottom transistor level L22, and the top transistor level L23, and an additional first metallization level L24. Layout patterns within the substrate level L21 (e.g., buried metal lines BM0), layout patterns in the bottom transistor level L22 (e.g., bottom gate regions, bottom fins and bottom source/drain contact regions), and layout patterns in the top transistor level L23 (e.g., top gate regions, top fins and top source/drain contact regions) are described previously with respect to FIGS. 13-14D, and are thus not repeated for the sake of brevity.

Layout patterns within the first metallization level L24 include first metal vias, labeled "V1," respectively over the top gate regions and top source/drain contact regions, and first metal lines, labeled "M1," respectively over the first metal vias V1. The first metal lines M1 include first metal line 331, 332, 333, 334, 335, and 336. The first metal line 331 is coupled to the Vdd contact 321 by using a first metal via V1. The first metal line 332 is coupled to the non-functional gate region 315 by using a first metal via V1. The first metal line 333 is coupled to the gate region 311 of the write-assist transistor WA2 by using a first metal via V1. The first metal line 334 is coupled to the gate region 312 of the pull-up transistor PU1 by using a first metal via V1. The first metal line 335 is coupled to the top contact 322 of storage node SNB by using a first metal via V1. The first metal line 336 is coupled to the top contact 323 of storage node SN by using a first metal via V1. Similarly, the first metal lines M1 includes a metal line coupled to the non-functional gate region 316, a metal line coupled to the gate region 314 of the write-assist transistor WA1, and a metal line coupled to the gate region 313 of the pull-up transistor PU2.

Figure 16:
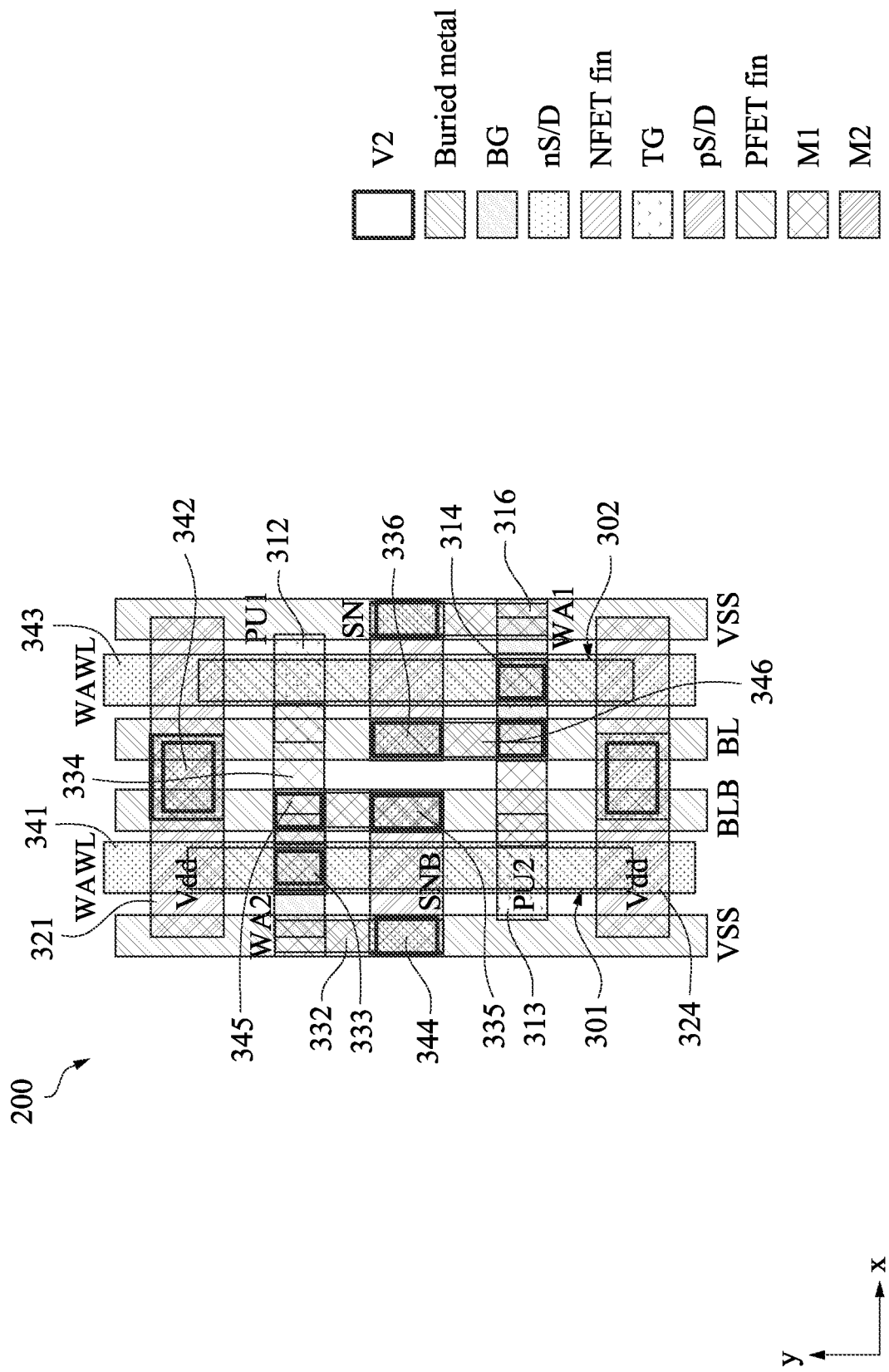
FIG. 16 depicts in a plan view a layout of an ST SRAM cell in accordance with some embodiments of the present disclosure.

FIG. 16 depicts in a plan view an overlaid layout of the 8T SRAM cell 200, wherein the layout is an overlaid layout of various levels including the substrate level L21, the bottom transistor level L22, the top transistor level L23, the first metallization level L24, and an additional second metallization level L25. Layout patterns within the substrate level L21 (e.g., buried metal lines BM0), layout patterns in the bottom transistor level L22 (e.g., bottom gate regions, bottom fins and bottom source/drain contact regions), layout patterns in the top transistor level L23 (e.g., top gate regions, top fins and top source/drain contact regions), and layout patterns in the first metallization level L24 (e.g., first metal lines M1 and first metal vias V1) are described previously with respect to FIGS. 13-15, and are thus not repeated for the sake of brevity. Layout patterns within the second metallization level L25 include second metal vias, labeled "V2," respectively over the first metal lines M1, and second metal lines, labeled "M2," respectively over the second metal vias V2. The first metal vias V1 within the first metallization level L24 are skipped in this layout for the sake of clarity.

The second metal lines M2 include second metal lines 341, 342, 343, 344, 345, and 346. The metal lines 341 and 343 are write-assist word lines WAWL extending in the y-direction. Write-assist word lines WAWL are respectively coupled to gate regions of the write-assist transistors WA1, WA2 by using respective second metal vias V2 and corresponding metal lines and vias in the first metallization level. The metal line 342 is coupled to the Vdd contact 321 by using a second metal via V2 and a corresponding metal line and via in the first metallization level. The metal line 344 is coupled to the underlying first metal line 332 by using a second metal via V2.

The second metal line 345 has a first end coupled to the underlying first metal line 334 by using a second metal via V2, and a second end coupled to the underlying first metal line 335 by using a second metal via V2. The second metal line 345 thus has the first end coupled to the gate terminals of transistors PU1, PD1, and the second end coupled to the storage node SNB. Therefore, input of the inverter formed of the transistors PU1, PD1 is coupled to the storage node SNB, which is output of the inverter formed of the transistors PU2, PD2. Similarly, the second metal line 346 has a first end coupled to the gate terminals of transistors PU2, PD2, and a second end coupled to the storage node SN. Therefore, input of the inverter formed of the transistors PU2, PD2 is coupled to the storage node SN, which is output of the inverter formed of the transistors PU1, PD1. By using the second metal lines 345 and 346, the transistors PU1, PU2, PD1 and PD2 collectively form a cross coupled pair of CMOS inverters. The metal lines 345 and 346 can be thus interchangeably referred to as cross-coupled lines.

Figure 17A:
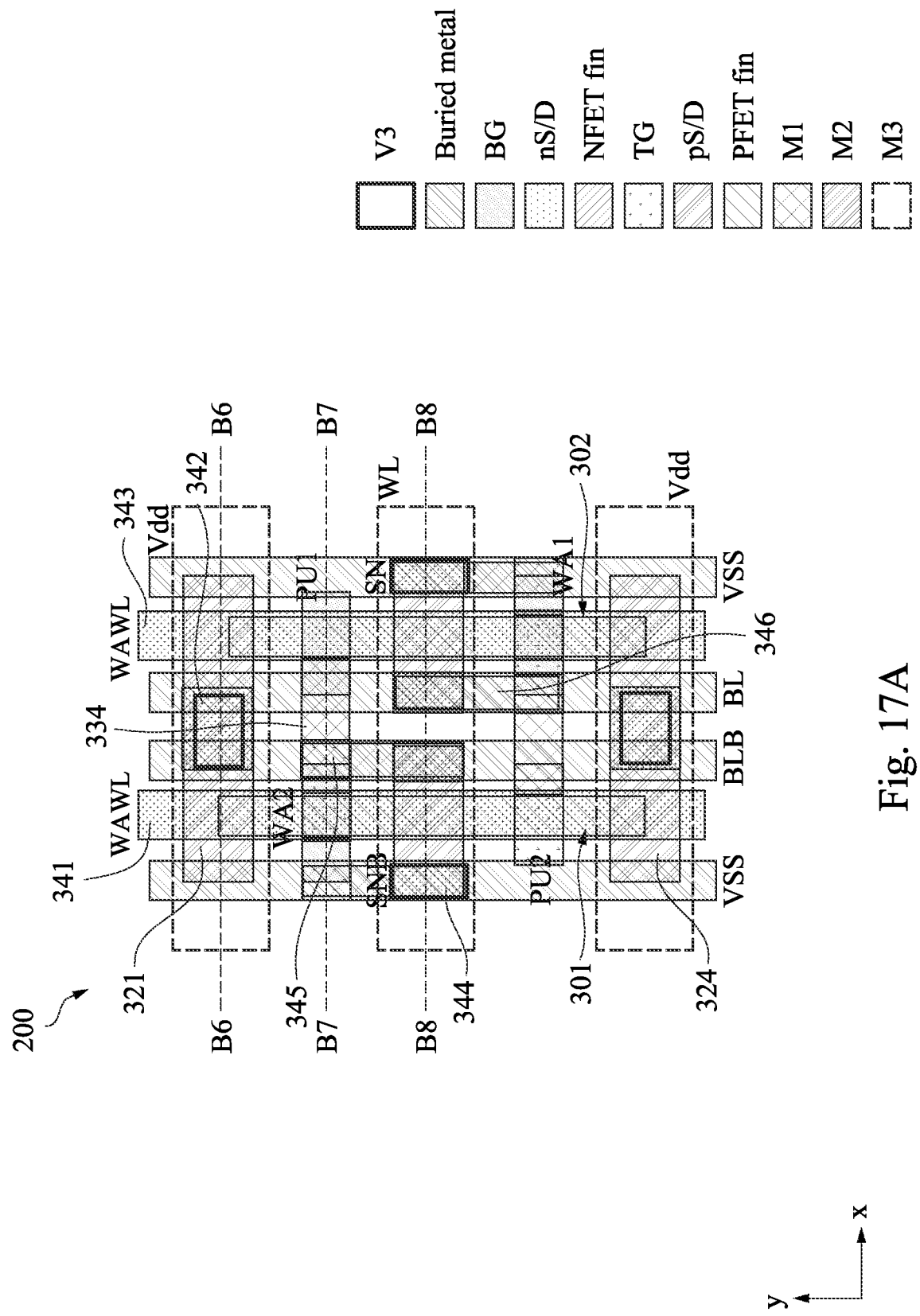
FIG. 17A depicts in a plan view a layout of an ST SRAM cell in accordance with some embodiments of the present disclosure.
Figure 17B:
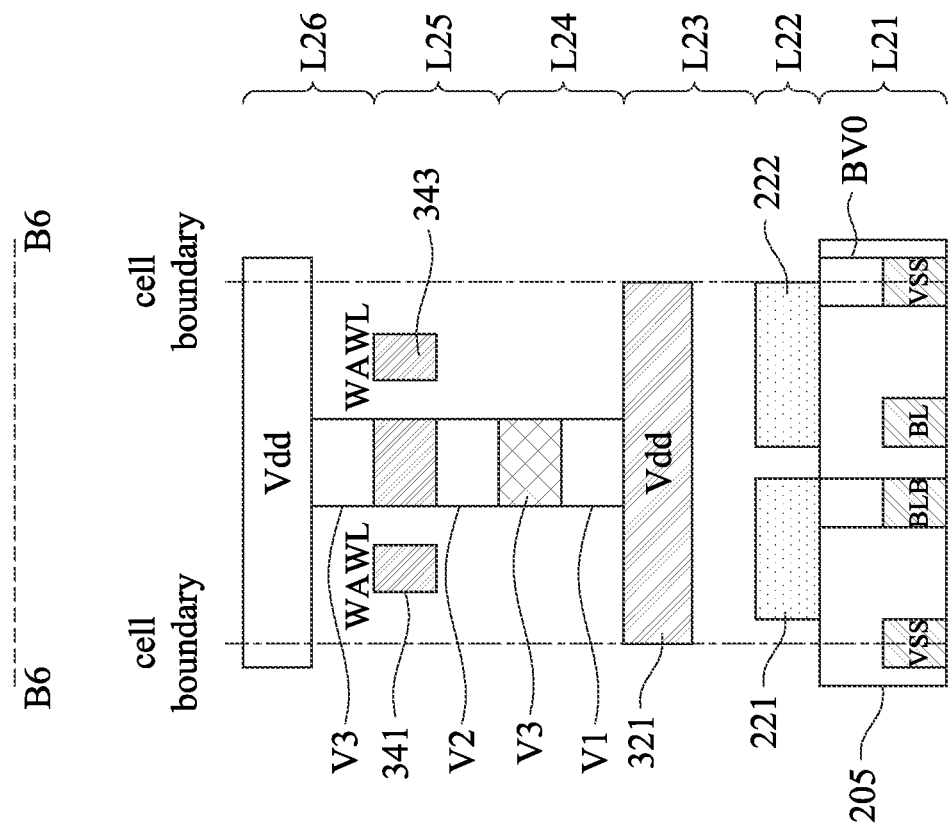
FIG. 17B is a cross-sectional view of the 8T SRAM cell along the cross-section B6-B6 in FIG. 17A.
Figure 17C:
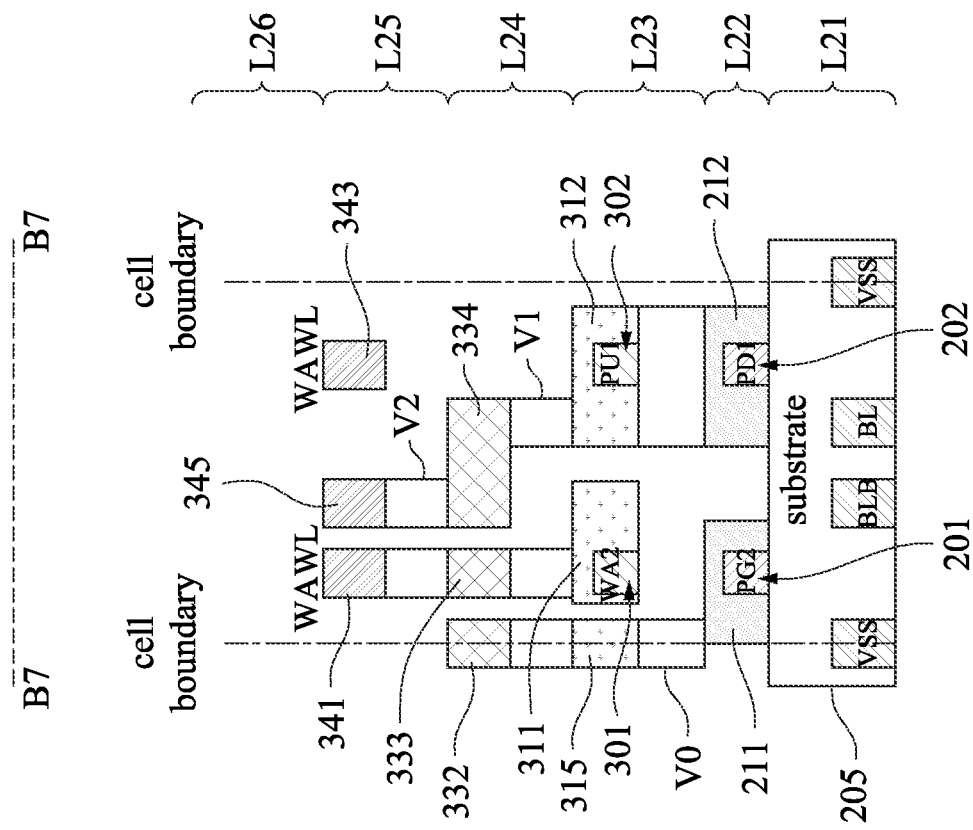
FIG. 17C is a cross-sectional view of the 8T SRAM cell along the cross-section B7-B7 in FIG. 17A.
Figure 17D:
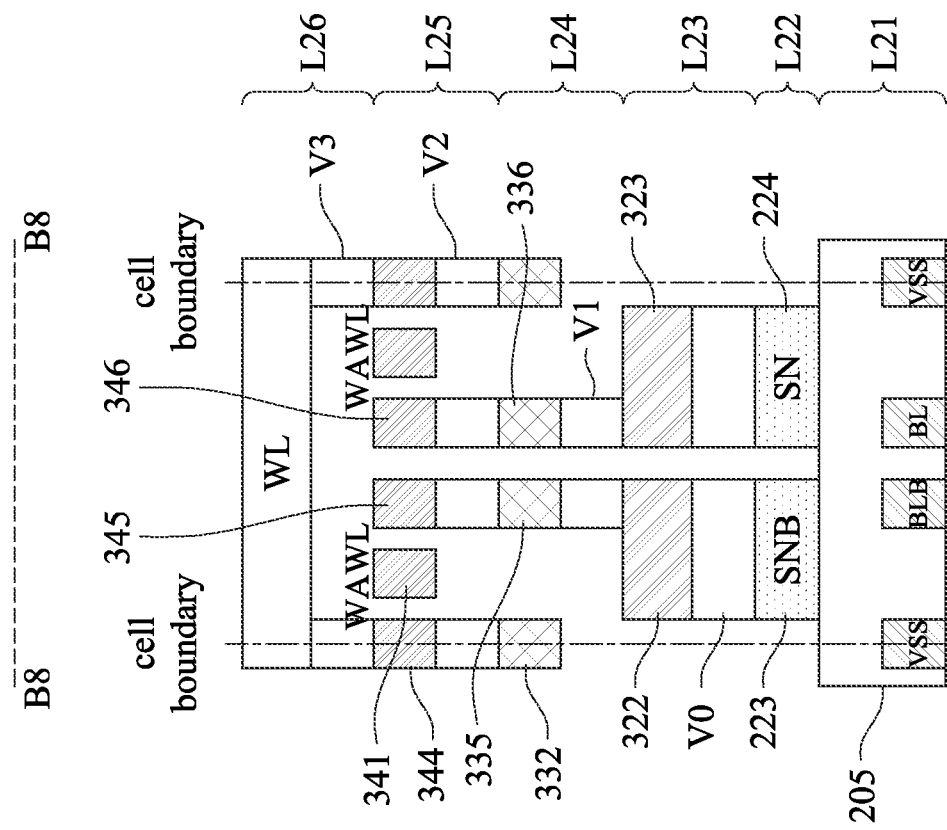
FIG. 17D is a cross-sectional view of the 8T SRAM cell along the cross-section B5-B8 in FIG. 17A.

FIG. 17A depicts in a plan view an overlaid layout of the 8T SRAM cell 200. FIG. 17B is a cross-sectional view of the 8T SRAM cell 200 along the cross-section B6-B6. FIG. 17C is a cross-sectional view of the 8T SRAM cell 200 along the cross-section B7-B7. FIG. 17D is a cross-sectional view of the 8T SRAM cell 200 along the cross-section B8-B8.

The layout illustrated in FIG. 17A is an overlaid layout of various levels including the substrate level L21, the bottom transistor level L22, the top transistor level L23, the first metallization level L24, the second metallization level L25, and an additional third metallization level L26. Layout patterns within the substrate level L21 (e.g., buried metal lines BM0), layout patterns in the bottom transistor level L22 (e.g., bottom gate regions, bottom fins and bottom source/drain contact regions), layout patterns in the top transistor level L23 (e.g., top gate regions, top fins and top source/drain contact regions), layout patterns in the first metallization level L24 (e.g., first metal lines M1 and first metal vias V1), and layout patterns in the second metallization level L25 (e.g., second metal lines M2 and second metal vias V2) are described previously with respect to FIGS. 13-16, and are thus not repeated for the sake of brevity. Layout patterns within the third metallization level L26 include third metal vias, labeled "V3," respectively over the second metal lines M2, and third metal lines, labeled "M3," respectively over the third metal vias V3. The first metal vias V1 within the first metallization level L24 and the second metal vias V2 within the second metallization level L25 are skipped in this layout for the sake of clarity.

The third metal lines M3 include a word line WL extending in the x direction. The word line WL is coupled to gate terminals of the pass-gate transistors PG1 and PG2 using respective third metal vias V3, metal lines and vias in underlying metallization levels L24, L25, and non-functional gate regions and inter-transistor vias in the top transistor level L23. Because the write-assist word lines WAWL extend in the y-direction within the second metallization level L25, and the word lines WL extend in the x-direction within the third metallization level L26, a target SRAM cell in a large array of SRAM cells can be precisely selected by using the column-wise write-assist word lines WAWL and the row-wise word lines WL, which in turn aids in mitigating the half select disturbance issue for the SRAM array.

The third metal lines M3 further include power supply lines Vdd extending in the x direction. Power supply lines Vdd are respectively coupled to the Vdd contacts 321, 324 by using respective third metal via V3, and corresponding metal lines and vias in underlying metallization levels L24, L25.

FIGS. 18A-26C are top views and cross-sectional views of intermediate stages in an example method for manufacturing bottom-transistor-level elements and top-transistor-level elements for a CFET-based SRAM cell 200, in accordance with some embodiments. Although the top views and cross-sectional views shown in FIGS. 18A-26C are described with reference to an example method for forming a CFET-based SRAM cell 200, it will be appreciated that the CFET-based SRAM cell 200 shown in FIGS. 18A-26C are not limited to the method but rather may stand alone separate of the method. Although FIGS. 18A-26C are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 18A:
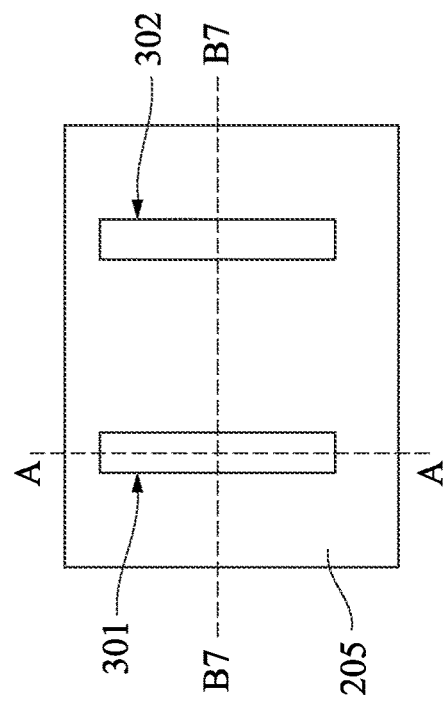
Figure 18B:
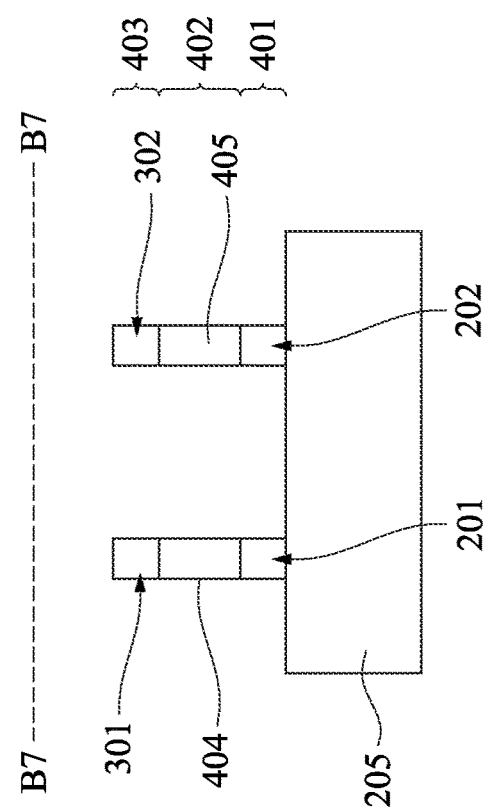
Figure 18C:
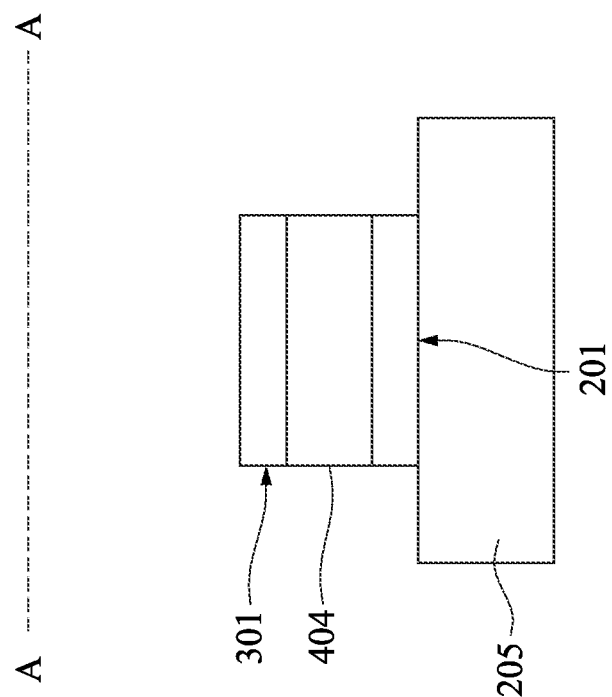

FIG. 18A is a top view of an example initial structure, FIG. 18B is a cross-sectional view along the along the cross-section B7-B7 of FIG. 18A, and FIG. 18C is a cross-sectional view along the along the cross-section A-A of FIG. 18A. The initial structure may include a semiconductor substrate 205, a bottom semiconductor layer 401 formed over the semiconductor substrate 205, a sacrificial layer 402 formed over the bottom semiconductor layer 401, and a top semiconductor layer 403 formed over the sacrificial layer 402. The substrate 205 may be a semiconductor substrate as described previously with respect to the substrate 105.

The structure as shown in FIGS. 18A-18C includes multi-layer stack formed over the substrate 205. The multi-layer stack includes the bottom semiconductor layer 401, the top semiconductor layer 403, and the sacrificial layer 402 interposing the bottom semiconductor layer 401 and the top semiconductor layer 403. For purposes of illustration and as discussed in greater detail below, the sacrificial layer 402 will be removed, the bottom semiconductor layer 401 will be patterned to form channel regions of transistors (e.g., pass-gate transistors PG1, PG2, and pull-down transistors PD1, PD2) in a lower level, and the top semiconductor layer 403 will be patterned to form channel regions of transistors (e.g., write-assist transistors WA1, WA2, and pull-up transistors PU1, PU2) in an upper level above the transistors formed from the bottom semiconductor layer 401.

Each of the layers of the multi-layer stack may be epitaxially grown using a process such as chemical vapor deposition (CVD), atomic layer deposition (ALD), vapor phase epitaxy (VPE), molecular beam epitaxy (MBE), or the like. In various embodiments, the bottom semiconductor layer 401 and the top semiconductor layer 403 may be formed of a semiconductor material suitable for serving as transistor channel regions, such as silicon, silicon carbon, silicon germanium, or the like. In some embodiments, the bottom semiconductor layer 401 and the top semiconductor layer 403 may be formed of different semiconductor materials. For example, the bottom semiconductor layer 401 may be formed of silicon carbon, and the top semiconductor layer 403 may be formed of silicon germanium. The sacrificial layer 402 may be materials having a high-etch selectivity to the semiconductor layers 401 and 403. As such, the sacrificial layer 402 may be removed without significantly removing the semiconductor layers 401 and 403, thereby allowing the semiconductor layers 401 and 403 to serve as transistor channel regions.

The multi-layer stack is then patterned to form fin structures protruding from the substrate 205 by using suitable photolithography and etching techniques. The etching may be any acceptable etch process, such as a reactive ion etch (RIE), neutral beam etch (NBE), the like, or a combination thereof. The etching may be anisotropic. The fin structure each including portions of bottom semiconductor layer 401, sacrificial layer 402, and top semiconductor layer 403. In FIGS. 18A-18C, two fin structures are formed, wherein a fin structure including a bottom fin 201, a sacrificial fin 404 over the bottom fin 201, and a top fin 301 over the sacrificial fin 404, and a fin structure including a bottom fin 202, a sacrificial fin 405 over the bottom fin 202, and a top fin 302 over the sacrificial fin 405.

Figure 19C:
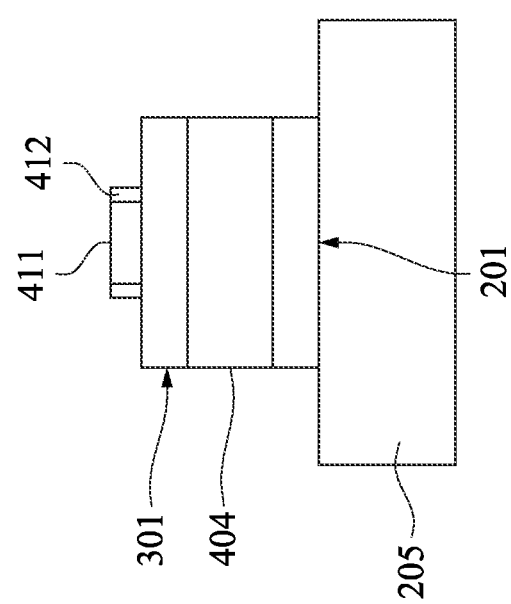

Reference is made to FIGS. 19A-19C, wherein FIG. 19A is a top view of an intermediate stage in the manufacturing method subsequent to FIGS. 18A-18C, FIG. 19B is a cross-sectional view along the along the cross-section B7-B7 of FIG. 19A, and FIG. 19C is a cross-sectional view along the along the cross-section A-A of FIG. 19A. As illustrated in FIGS. 19A-19C, a dummy gate structure 411 is formed across the fin structures. In some embodiments, the dummy gate structure 411 may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric. A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure 411 may extend along multiple sides of the fin structures. As described in greater detail below, the dummy gate structure 411 may be replaced by a replacement gate structure in a subsequent step. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

After forming the dummy gate structure 411, a gate spacer 412 is formed, for example, self-aligned to the dummy gate structure 411. The gate pacer 412 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structure 411 leaving the gate spacer 412 along the sidewalls of the dummy gate structure 411.

Figure 20A:
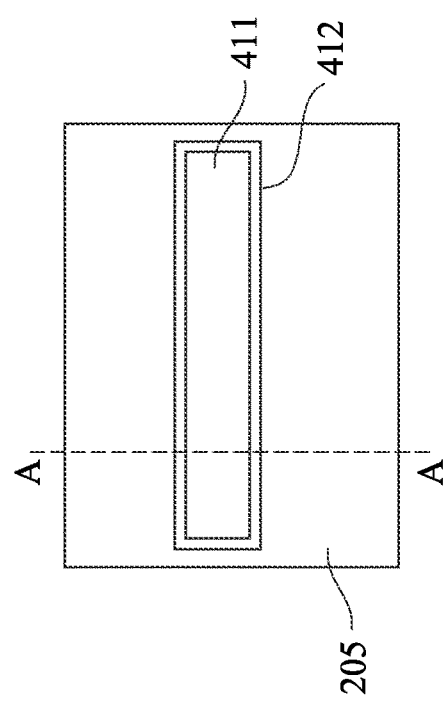
Figure 20B:
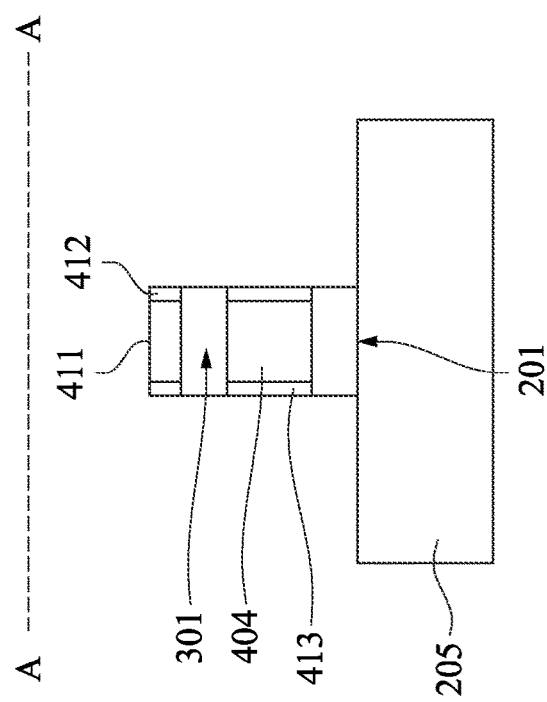

Reference is made to FIGS. 20A-20B, wherein FIG. 20A is a top view of an intermediate stage in the manufacturing method subsequent to FIGS. 19A-19C, and FIG. 20B is a cross-sectional view along the along the cross-section A-A of FIG. 20A. As illustrated in FIGS. 20A-20B, portions of the fin structures expend beyond the gate spacers 412 and the dummy gate structure 411 are removed by using suitable photolithography and etching techniques. Next, the sacrificial fin 404 in the fin structure is laterally recessed by using selective etching, thus forming recesses between bottom fin and top fin in each fin structure. Inner spacers 413 are then formed in the recesses by using, for example, depositing a dielectric material over the substrate 205, followed by anisotropically etching the dielectric material to remove portions of the dielectric material outside the recesses, while leaving portions of the dielectric material in the recesses to serve as inner spacers 413. In some embodiments, the inner spacers 413 may comprise a dielectric material such as silicon nitride or silicon oxynitride, although any suitable material, such as low-dielectric constant (low-k) materials having a k-value less than about 3.5, may be utilized.

Figure 21A:
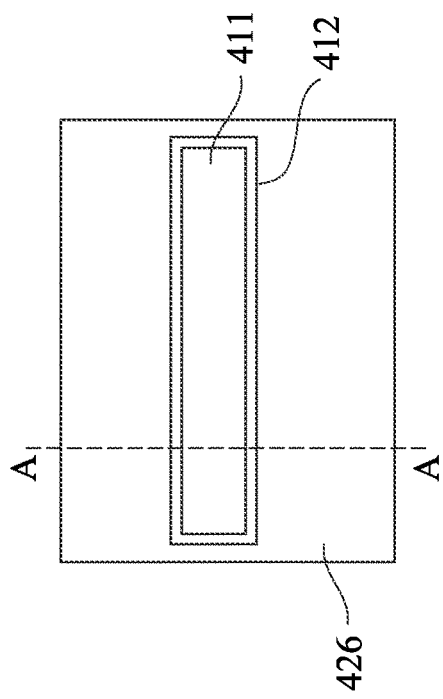
Figure 21B:
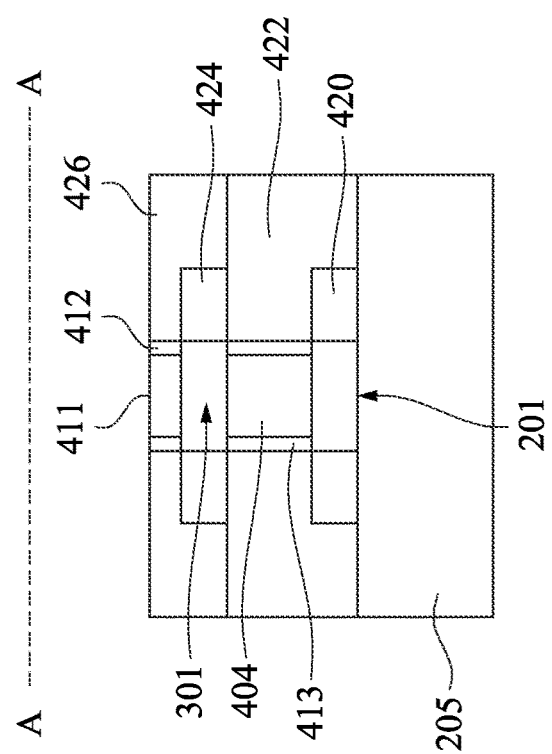

Reference is made to FIGS. 21A-21B, wherein FIG. 21A is a top view of an intermediate stage in the manufacturing method subsequent to FIGS. 20A-20B, and FIG. 21B is a cross-sectional view along the along the cross-section A-A of FIG. 21A. FIGS. 21A-21B illustrate formation of source/drain regions of bottom transistors and top transistors. As illustrated in FIGS. 21A-218, bottom source/drain regions 420 are epitaxially grown from the bottom fins (e.g., bottom fin 201). In some embodiments, the bottom source/drain regions 420 may exert stress on the bottom fins, thereby improving device performance. The dummy gate structure 411 is disposed between respective neighboring pairs of the epitaxial source/drain regions 420. The bottom source/drain regions 420 may be formed using a selective epitaxy growth (SEG) process. In some embodiments, some epitaxial materials may be unintentionally grown on the top fins (e.g., top fin 301). In that case, these epitaxial materials can be removed from the top fins by using, for example, an angled etching process that etches the epitaxial materials on the top fins, while leaving epitaxial material intact on the bottom fins due to shadowing effect resulting from a tilting angle of ion beams used in the angled etching process.

In some embodiments where the bottom transistors are n-type transistors (e.g., pass-gate transistors PG1, PG2, and pull-down transistors PD1, PD2), the epitaxial source/drain regions 420 may include any acceptable material appropriate for n-type transistors. For example, if the bottom fins are silicon, the bottom source/drain regions 420 may include materials exerting a tensile strain on the bottom fins, such as silicon carbide, phosphorous doped silicon carbide, silicon phosphide, or the like. The bottom source/drain regions 420 may be implanted with an n-type dopant to form n-type source/drain regions, followed by an anneal. In some embodiments, the bottom source/drain regions 420 may be in situ doped during growth. In some embodiments, the transistors PG2 and PD2 share a common epitaxial source/drain region 420 at storage node SNB, and the transistors PG1 and PD1 share a common epitaxial source/drain region 420 at storage node SN.

In some embodiments, a dielectric layer 422 is formed over the bottom source/drain regions 420, and then top source/drain regions 424 are epitaxially grown from exposed regions of the top fins (e.g., top fin 301) by using, for example, a selective epitaxy growth (SEG) process. The dielectric layer 422 can prevent unintentional epitaxial growth takes place on the bottom source/drain regions 420 during forming the top source/drain regions 424. In some embodiments, the top source/drain regions 424 may exert stress on the top fins, thereby improving device performance.

In some embodiments where the top transistors are p-type transistors (e.g., transistors WA1, WA2, PU1, PU2), the top source/drain regions 424 may include any acceptable material appropriate for p-type transistors. For example, if the top fins are silicon, the top source/drain regions 424 may comprise materials exerting a compressive strain on the top fins, such as silicon germanium, boron doped silicon germanium, germanium, germanium tin, or the like. The top source/drain regions 424 may be implanted with a p-type dopant to form p-type source/drain regions, followed by an anneal. In some embodiments, the top source/drain regions 424 may be in situ doped during growth. A dielectric layer 426 can then be formed over the top source/drain regions 424 by using suitable deposition, followed by a planarization process (e.g., CMP) until the dummy gate structure 411 is exposed. In some embodiments, the transistors WA2 and PU2 share a common epitaxial source/drain region 424 at storage node SNB, and the transistors WA1 and PU1 share a common epitaxial source/drain region 424 at storage node SN.

Figure 22A:
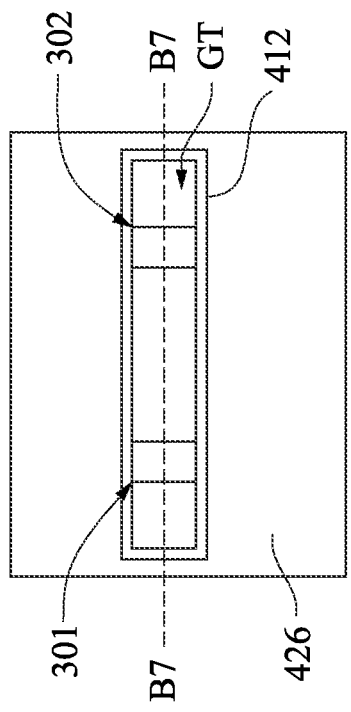
Figure 22B:
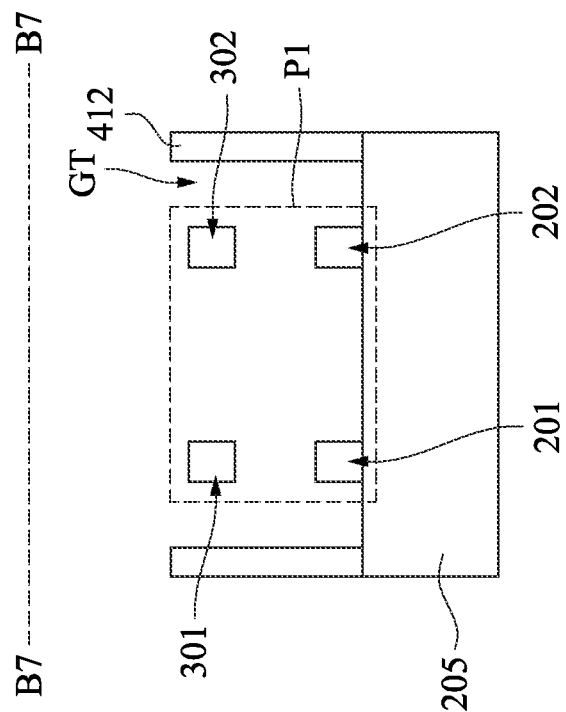
Figure 22C:
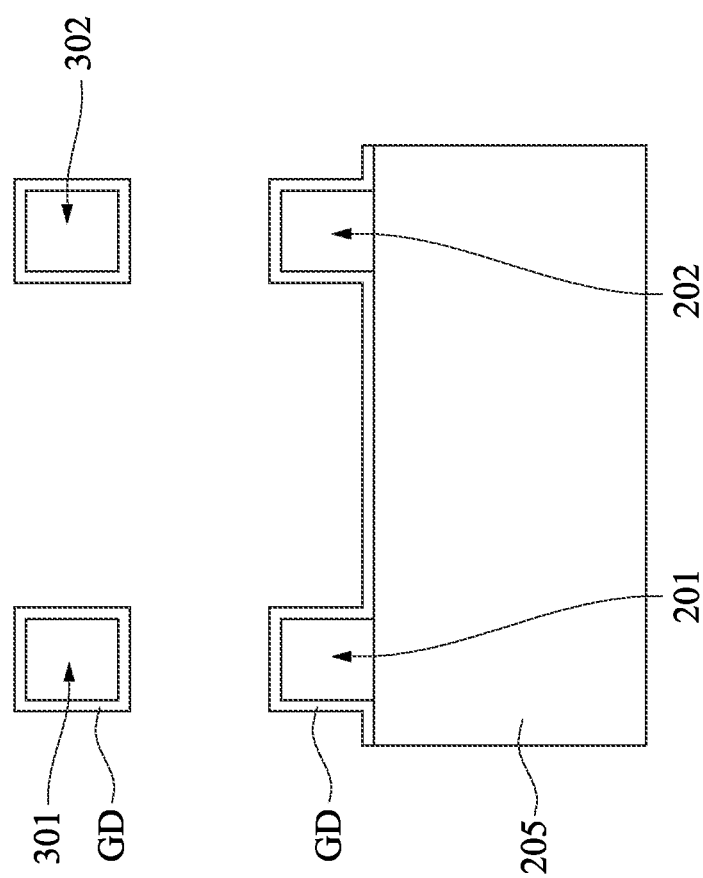
Figure 23A:
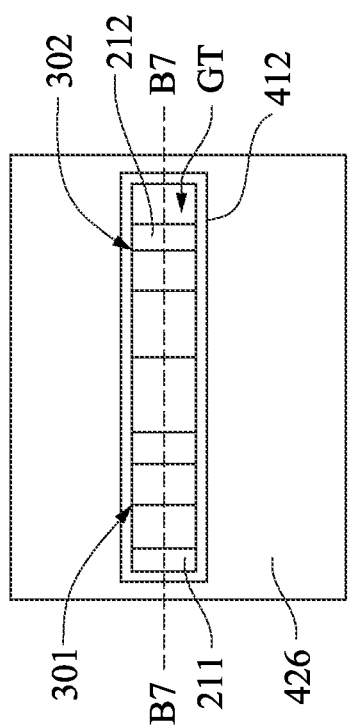
Figure 23B:
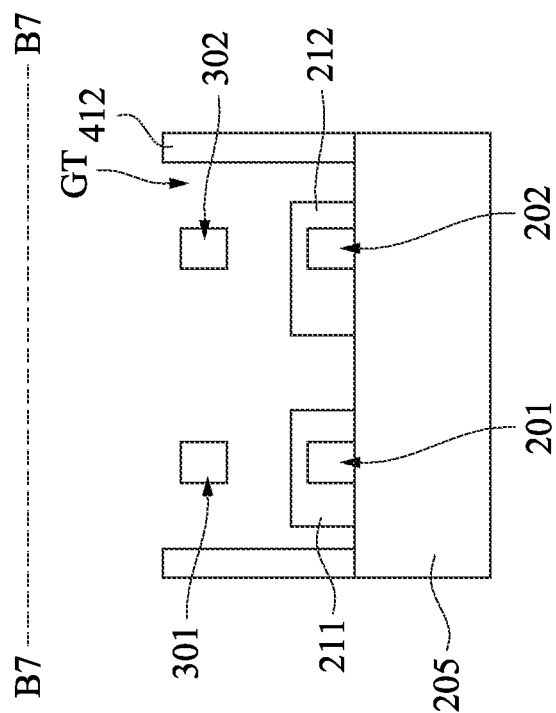
Figure 24A:
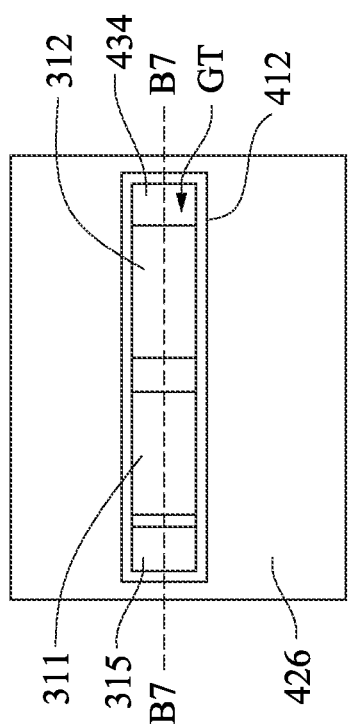
Figure 24B:
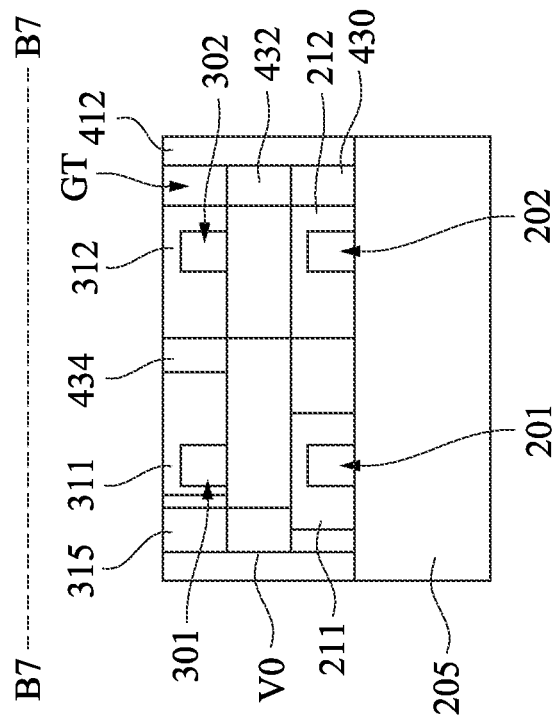

FIGS. 22A-24B illustrate an example method in forming bottom gate regions, inter-transistor vias, and top gate regions. Reference is made to FIGS. 22A-22C, wherein FIG. 22A is a top view of an intermediate stage in the manufacturing method subsequent to FIGS. 21A-21B, FIG. 22B is a cross-sectional view along the along the cross-section B7-B7 of FIG. 22A, and FIG. 22C is a zoomed-in view of an area P1 in FIG. 22B. As illustrated in FIGS. 22A-22B, the dummy gate structure 411 is removed by using a selective etching process to form a gate trench GT confined by the gate spacer 412. Next, the sacrificial fins 404, 405 exposed in the gate trench GT are removed by another selective etching process that etches the sacrificial fins at a faster etch rate than etching the bottom fins 201, 202 and top fins 301, 303 and the substrate 205. FIG. 22C illustrates gate dielectric layers GD formed respectively over the bottom fins 201, 202, and top fins 301, 303. In some embodiments, the gate dielectric layers GD may be formed by thermal oxidation to selectively grow oxide materials on surfaces of the bottom fins 201, 202 and top fins 301, 303. In some embodiments, the gate dielectric layers GD may further include one or more high-k dielectric materials, such as hafnium oxide (HfO$_2$) or other suitable metal oxides. The gate dielectric layers GD are not illustrated in global views of gate regions as illustrated in FIGS. 22B, 23B, and 24B for the sake of clarity.

Reference is made to FIGS. 23A-23B, wherein FIG. 23A is a top view of an intermediate stage in the manufacturing method subsequent to FIGS. 22A-22C, FIG. 23B is a cross-sectional view along the along the cross-section B7-B7 of FIG. 23A. As illustrate in FIGS. 23A-23B, bottom gate regions 211 and 212 are formed over the bottom fins 201 and 202, respectively. Formation of the bottom gate regions 211, 212 may include, by way of example and not limitation, depositing one or more metal materials in the gate trench GT, selectively etching back the one or more metal materials to fall below the top fins 301 and 302, patterning the one or more metal materials into the bottom gate regions 211 and 212 by using suitable lithography and etching techniques.

Reference is made to FIGS. 24A-24B, wherein FIG. 24A is a top view of an intermediate stage in the manufacturing method subsequent to FIGS. 23A-23B, FIG. 24B is a cross-sectional view along the along the cross-section B7-B7 of FIG. 24A. As illustrate in FIGS. 24A-24B, a dielectric layer 430 is formed around the bottom gate regions 211, 212, for example, by depositing a dielectric material in the gate trench GT, followed by selectively etching back the dielectric material to form the dielectric layer 430. Inter-transistor vias V0 are formed over the bottom gate regions 211, 212 and dielectric layer 430, for example, by depositing one or more metal materials in the gate trench OT, selectively etching back the one or more metal materials to fall below the top fins 301, 302, followed by patterning the one or more metal materials into the inter-transistor vias V0. A dielectric layer 432 may be formed around the inter-transistor vias V0, for example, by depositing a dielectric material in the gate trench GT, followed by selectively etching back the dielectric material to form the dielectric layer 432.

Functional top gate regions 311, 312 are formed over the top fins 301 and 302, respectively. The functional top gate regions 311 and 312 can serve as gate terminals to control current flow within the top fins 301 and 302. Non-functional gate region 315 is formed over the inter-transistor via V0 that is in contact with the bottom gate region 211. The non-functional gate region 315 does not serve as a transistor gate. Instead, the non-functional gate region 315 serve for coupling the bottom gate region 211 to a word line. Formation of the top gate regions 311, 312, and 315 may include, by way of example and not limitation, depositing one or more metal materials in the gate trench GT, planarizing the one or more metal materials by using CMP until the gate spacers 412 get exposed, patterning the one or more metal materials into the top gate regions 311, 312, and 315 by using suitable lithography and etching techniques. A dielectric layer 434 may be formed around the top gate regions 311, 312, and 315, for example, by depositing a dielectric material in the gate trench GT, followed by planarizing the dielectric material to form the dielectric layer 434.

Figure 25A:
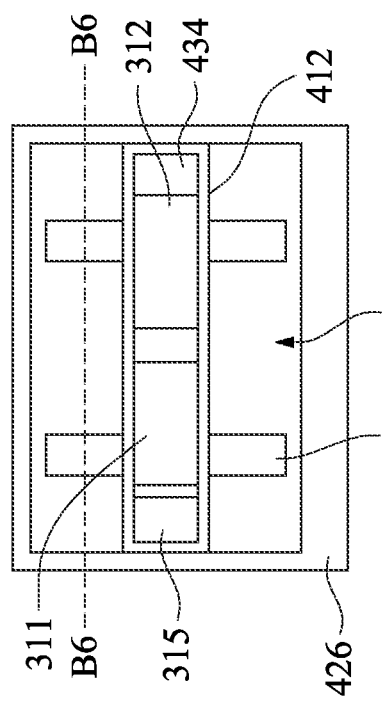

FIGS. 25A-26C illustrate an example method in forming bottom source/drain contact regions, inter-transistor vias, and top source/drain regions. Reference is made to FIGS. 25A-25B, wherein FIG. 25A is a top view of an intermediate stage in the manufacturing method subsequent to FIGS. 24A-24B, FIG. 25B is a cross-sectional view along the along the cross-section B6-B6 of FIG. 25A. As illustrated in FIG. 25A-25B, contact trenches CT are formed in the dielectric layers 422, 426 by using suitable lithography and etching techniques.

Figure 25B:
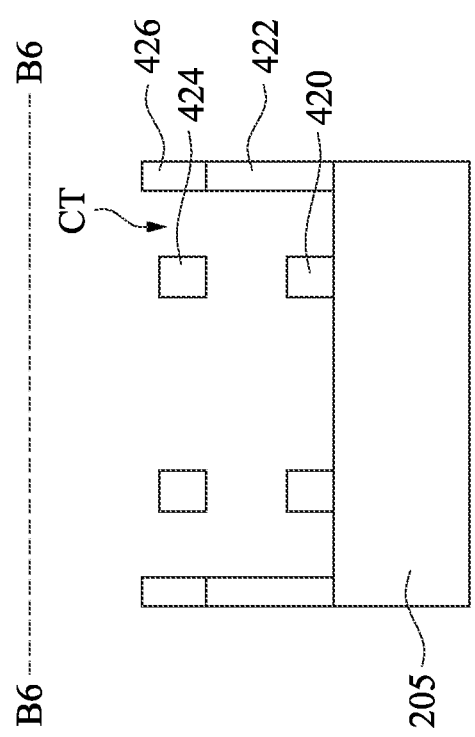

Reference is made to FIGS. 26A-26C, wherein FIG. 26A is a top view of an intermediate stage in the manufacturing method subsequent to FIGS. 25A-25B, FIG. 26B is a cross-sectional view along the along the cross-section B6-B6 of FIG. 26A, and FIG. 26C is a cross-sectional view along the along the cross-section B8-B8 of FIG. 26A. As illustrated in FIGS. 26A-26C, bottom source/drain contact regions 221-224 are formed over the respective bottom source/drain regions 420. Formation of the bottom source/drain contact regions 221-224 may include, by way of example and not limitation, depositing one or more metal materials in the contact trenches CT, selectively etching back the one or more metal materials to fall below the top source/drain regions 424, patterning the one or more metal materials into the bottom source/drain contact regions 221-224 by using suitable lithography and etching techniques.

In some embodiments, dielectric layers 440 are formed around the bottom source/drain regions 221-224, for example, by depositing a dielectric material in the contact trenches CT, followed by selectively etching back the dielectric material to form the dielectric layers 440. In some embodiments, inter-transistor vias V0 are formed over the bottom source/drain contact regions 221-224 and dielectric layer 440, for example, by depositing one or more metal materials in the contact trenches CT, selectively etching back the one or more metal materials to fall below the top source/drain regions 424, followed by patterning the one or more metal materials into the inter-transistor vias V0. Dielectric layers 442 may be formed around the inter-transistor vias V0, for example, by depositing a dielectric material in the contact trenches CT, followed by selectively etching back the dielectric material to form the dielectric layers 442. In some embodiments, formation of the top source/drain contact regions 321-323 may include, by way of example and not limitation, depositing one or more metal materials in the contact trenches CT, planarizing the one or more metal materials by using CMP until the gate spacers 412 get exposed, patterning the one or more metal materials into the top source/drain contact regions 321-323 by using suitable lithography and etching techniques. In some embodiments, dielectric layers 444 may be formed around the top source/drain contact regions 321-323, for example, by depositing a dielectric material in the gate trenches CT, followed by planarizing the dielectric material to form the dielectric layers 444.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the charging and/or discharging operations of SRAM storage nodes during the write operation can be accelerated by using write-assist transistors coupled to drains of pull-up transistors, which in turn improves write speed of SRAM cells. Another advantage is that integrating the write-assist transistors into a 6T SRAM cell will cause no footprint increase in the SRAM cell, because the write-assist transistors and pull-up transistors can be formed on same fins, sharing common source/drain regions. Another advantage is that the half select disturbance about SRAM cells can be mitigated by using the column-wise write-assist word lines and the row-wise word lines.

In some embodiments, An SRAM cell includes a first active region, a first gate structure, a second gate structure, and a first source/drain contact region. The first gate structure is over the first active region and forms a pull-up transistor with the first active region. The second gate structure is over the first active region and forms a write-assist transistor with the first active region. The write-assist transistor and the pull-up transistor are of a same conductivity type. The first source/drain contact region is over a source/drain of the write-assist transistor and a source/drain of the pull-up transistor. In some embodiments, from a plan view the second gate structure has a length different than a length of the first gate structure. In some embodiments, the SRAM cell further includes a second active region. The first gate structure is further over the second active region and forms a pull-down transistor with the second active region. The second gate structure does not overlap the second active region. In some embodiments, the SRAM cell further includes a third gate structure over the second active region and forming a pass-gate transistor with the second active region. The third gate structure is aligned with the second gate structure and separated from the second gate structure. In some embodiments, the write-assist transistor has a source/drain coupled to a Vss line or a Vdd line. In some embodiments, the SRAM cell further comprises a second active region at a different level height than the first active region, and a third gate structure forming a pass-gate transistor with the second active region. The second gate structure has a portion overlapping the third gate structure and is electrically isolated from the third gate structure. In some embodiments, the SRAM cell further includes a fourth gate structure forming a pull-down transistor with the second active region, and a first metal via extending from the first gate structure to the fourth gate structure. In some embodiments, the SRAM cell further includes a second source/drain contact region over a source/drain of the pass-gate transistor and a source/drain of the pull-down transistor, and a second metal via extending from the first source/drain contact region to the second source/drain contact region. In some embodiments, the SRAM cell further incudes a third source/drain contact region over a source/drain of the pass-gate transistor, a bit line in a substrate below the third source/drain contact region, and a third metal via in the substrate and extending from the third source/drain contact region to the bit line in the substrate. In some embodiments, the SRAM cell further includes a third source/drain contact region over a source/drain of the pull-down transistor, a Vss line in a substrate below the third source/drain contact region, and a third metal via in the substrate and extending from the third source/drain contact region to the Vss line in the substrate.

In some embodiments, an SRAM cell includes a pass-gate transistor and a write-assist transistor. The pass-gate transistor includes a first source/drain terminal coupled to a bit line, a second source/drain terminal coupled to a storage node, and a gate terminal coupled to a word line. The write-assist transistor includes a source/drain terminal coupled to the storage node, and a gate terminal coupled to a write-assist word line. From a plan view, the word line extends in a first direction, and the write-assist word line extends in a second direction different from the first direction. From a cross-sectional view, the write-assist word line is located at a different level height than the word line. In some embodiments, the write-assist word line is located at a position lower than the word line. In some embodiments, the SRAM cell includes a fin extending in the second direction, wherein the write-assist transistor is formed on the fin. In some embodiments, the first direction is orthogonal to the second direction. In some embodiments, the bit line extends in the second direction. In some embodiments, the bit line is at a same level height as the write-assist word line. In some embodiments, the bit line is in a substrate below the write-assist word line.

In some embodiments, a method includes forming a pull-up transistor and a write-assist transistor on a first fin, the first fin having a p-type source/drain region shared by the pull-up transistor and the write-assist transistor; forming a pull-down transistor and a pass-gate transistor on a second fin, the second fin having an n-type source/drain region shared by the pass-gate transistor and the pull-down transistor; and forming a first contact region over the p-type source/drain region shared by the pull-up transistor and the write-assist transistor. In some embodiments, the first contact region is further over the n-type source/drain region shared by the pass-gate transistor and the pull-down transistor. In some embodiments, the method further comprises forming a second contact region over the n-type source/drain region and directly below the first contact region, and forming a via extending from a bottom surface of the first contact region to a top surface of the second contact region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell, comprising:
a first active region;
a first gate structure over the first active region and forming a pull-up transistor with the first active region;
a second gate structure over the first active region and forming a write-assist transistor with the first active region, wherein the write-assist transistor and the pull-up transistor are of a same conductivity type, wherein from a plan view, the second gate structure has a length different than a length of the first gate structure; and
a first source/drain contact region over a source/drain of the write-assist transistor and a source/drain of the pull-up transistor.

2. The SRAM cell of claim 1, further comprising:
a second active region, wherein the first gate structure is further over the second active region and forms a pull-down transistor with the second active region, and the second gate structure does not overlap the second active region.

3. The SRAM cell of claim 2, further comprising:
a third gate structure over the second active region and forming a pass-gate transistor with the second active region, wherein the third gate structure is aligned with the second gate structure and separated from the second gate structure.

4. The SRAM cell of claim 1, wherein the write-assist transistor has a source/drain coupled to a Vss line or a Vdd line.

5. The SRAM cell of claim 1, further comprising:
a second active region at a different level height than the first active region; and
a third gate structure forming a pass-gate transistor with the second active region, the second gate structure having a portion overlapping the third gate structure and electrically isolated from the third gate structure.

6. The SRAM cell of claim 5, further comprising:
a fourth gate structure forming a pull-down transistor with the second active region; and
a first metal via extending from the first gate structure to the fourth gate structure.

7. The SRAM cell of claim 6, further comprising:
a second source/drain contact region over a source/drain of the pass-gate transistor and a source/drain of the pull-down transistor; and
a second metal via extending from the first source/drain contact region to the second source/drain contact region.

8. The SRAM cell of claim 7, further comprising:
a third source/drain contact region over a source/drain of the pass-gate transistor;
a bit line in a substrate below the third source/drain contact region; and
a third metal via in the substrate and extending from the third source/drain contact region to the bit line in the substrate.

9. The SRAM cell of claim 7, further comprising:
a third source/drain contact region over a source/drain of the pull-down transistor;
a Vss line in a substrate below the third source/drain contact region; and
a third metal via in the substrate and extending from the third source/drain contact region to the Vss line in the substrate.

10. An SRAM cell, comprising:
a pass-gate transistor comprising a first source/drain terminal coupled to a bit line, a second source/drain terminal coupled to a storage node, and a gate terminal coupled to a word line; and
a write-assist transistor comprising a source/drain terminal coupled to the storage node, and a gate terminal coupled to a write-assist word line, wherein from a plan view, the word line extends in a first direction, and the write-assist word line extends in a second direction different from the first direction, and from a cross-sectional view, the write-assist word line is located at a different level height than the word line, wherein the write-assist word line is located at a position lower than the word line.

11. The SRAM cell of claim 10, further comprising:
a fin extending in the second direction, wherein the write-assist transistor is formed on the fin.

12. The SRAM cell of claim 10, wherein the first direction is orthogonal to the second direction.

13. The SRAM cell of claim 10, wherein the bit line extends in the second direction.

14. The SRAM cell of claim 10, wherein the bit line is at a same level height as the write-assist word line.

15. The SRAM cell of claim 10, wherein the bit line is in a substrate below the write-assist word line.

16. A method of forming an SRAM cell, comprising:
forming a pull-up transistor and a write-assist transistor on a first fin, the first fin having a p-type source/drain region shared by the pull-up transistor and the write-assist transistor;
forming a pull-down transistor and a pass-gate transistor on a second fin, the second fin having an n-type source/drain region shared by the pass-gate transistor and the pull-down transistor;
forming a first contact region over the p-type source/drain region shared by the pull-up transistor and the write-assist transistor; and
forming a write-assist word line electrically coupled to a gate terminal of the write-assist transistor, and a word line electrically coupled to a gate terminal of the pass-gate transistor, wherein the write-assist word line is located at a position lower than the word line.

17. The method of claim 16, wherein the first contact region is further over the n-type source/drain region shared by the pass-gate transistor and the pull-down transistor.

18. The method of claim 16, further comprising:
   forming a second contact region over the n-type source/drain region, the second contact region is directly below the first contact region; and
   forming a via extending from a bottom surface of the first contact region to a top surface of the second contact region.

19. The SRAM cell of claim 1, wherein the length of the second gate structure is less than the length of the first gate structure.

20. The method of claim 16, wherein the pull-up transistor has a first gate structure, the write-assist transistor has a second gate structure serving as the gate terminal of the write-assist transistor, wherein from a plan view, the second gate structure has a length different than a length of the first gate structure.

* * * * *